United States Patent
Chae et al.

(10) Patent No.: US 9,530,939 B2
(45) Date of Patent: Dec. 27, 2016

(54) LIGHT EMITTING DIODE FOR SURFACE MOUNT TECHNOLOGY, METHOD OF MANUFACTURING THE SAME, AND METHOD OF MANUFACTURING LIGHT EMITTING DIODE MODULE

(71) Applicant: Seoul Viosys Co., Ltd., Ansan-si (KR)

(72) Inventors: Jong Hyeon Chae, Ansan-si (KR); Jong Min Jang, Ansan-si (KR); Won Young Roh, Ansan-si (KR); Dae Woong Suh, Ansan-si (KR); Min Woo Kang, Ansan-si (KR); Joon Sub Lee, Ansan-si (KR); Hyun A Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/171,431

(22) Filed: Jun. 2, 2016

(65) Prior Publication Data

US 2016/0276542 A1 Sep. 22, 2016

Related U.S. Application Data

(63) Continuation of application No. 14/677,904, filed on Apr. 2, 2015, now Pat. No. 9,397,269, which is a
(Continued)

(30) Foreign Application Priority Data

Jun. 28, 2012 (KR) ........................ 10-2012-0070129

(51) Int. Cl.
*H01L 33/40* (2010.01)
*H01L 33/46* (2010.01)
(Continued)

(52) U.S. Cl.
CPC ............ *H01L 33/405* (2013.01); *H01L 33/005* (2013.01); *H01L 33/007* (2013.01); *H01L 33/06* (2013.01);
(Continued)

(58) Field of Classification Search
CPC ...... H01L 33/486; H01L 33/46; H01L 33/405; H01L 33/45; H01L 33/0079; H01L 33/007
See application file for complete search history.

(56) References Cited

U.S. PATENT DOCUMENTS 7,723,737 B2 5/2010 Lee et al.
8,546,836 B2 10/2013 Kamiya et al.
(Continued)

FOREIGN PATENT DOCUMENTS

CN 101997072 3/2011
JP 2007019467 1/2007
(Continued)

OTHER PUBLICATIONS

International Search Report issued Aug. 28, 2003, in PCT Application No. PCT/KR2013/005254.
(Continued)

*Primary Examiner* — William Coleman
(74) *Attorney, Agent, or Firm* — H.C. Park & Associates, PLC

(57) ABSTRACT

A light emitting diode (LED) includes a substrate, a first semiconductor layer disposed on the substrate, an active layer disposed on a portion of the first semiconductor layer, a second semiconductor layer disposed on the active layer, a reflection pattern disposed on a portion of the second semiconductor layer, and a first insulating layer including a first portion having a first thickness and a second portion having a second thickness different from the first thickness, in which the first portion is disposed on the reflection pattern
(Continued)

or the first semiconductor layer and the second portion is disposed on the second semiconductor layer.

20 Claims, 16 Drawing Sheets

Related U.S. Application Data continuation of application No. 14/585,125, filed on Dec. 29, 2014, now Pat. No. 9,293,660, which is a continuation-in-part of application No. PCT/KR2013/005254, filed on Jun. 14, 2013.

(51) Int. Cl.
    *H01L 33/00*      (2010.01)
    *H01L 33/48*      (2010.01)
    *H01L 33/60*      (2010.01)
    *H01L 33/62*      (2010.01)
    *H01L 33/12*      (2010.01)
    *H01L 33/06*      (2010.01)
    *H01L 33/32*      (2010.01)
    *H01L 33/38*      (2010.01)
    *H01L 33/44*      (2010.01)

(52) U.S. Cl.
    CPC ............... *H01L 33/12* (2013.01); *H01L 33/32* (2013.01); *H01L 33/40* (2013.01); *H01L 33/46* (2013.01); *H01L 33/486* (2013.01); *H01L 33/60* (2013.01); *H01L 33/62* (2013.01); *H01L 33/382* (2013.01); *H01L 33/44* (2013.01); *H01L 2933/0016* (2013.01); *H01L 2933/0025* (2013.01); *H01L 2933/0058* (2013.01); *H01L 2933/0066* (2013.01)

(56) References Cited

U.S. PATENT DOCUMENTS

2006/0071228 A1    4/2006   Sun
2006/0249736 A1   11/2006   Lee et al.
2014/0209955 A1    7/2014   Kim et al.
2014/0231849 A1    8/2014   Song et al.

FOREIGN PATENT DOCUMENTS

| JP | 2007234918 | 9/2007 |
| JP | 2009188422 | 8/2009 |
| JP | 2010263016 | 11/2010 |
| JP | 2011187556 | 9/2011 |
| KR | 100609117 | 7/2006 |
| KR | 20100036618 | 4/2010 |

OTHER PUBLICATIONS

Chinese Patent Office, Chinese Application No. 201380034938.9, Office Action dated Oct. 23, 2015.

Korean Intellectual Property Office, Korean Application No. 10-2012-0070129, Office Action, Feb. 23, 2016.

Non-Final Office Action issued Sep. 22, 2015, in U.S. Appl. No. 14/677,904.

Notice of Allowance mailed Apr. 27, 2016, in U.S. Appl. No. 14/677,904.

Non-Final Office Action issued Aug. 14, 2015, in U.S. Appl. No. 14/585,125.

Notice of Allowance mailed Nov. 6, 2015, in U.S. Appl. No. 14/585,125.

A - A'

B - B'

C - C'

LIGHT EMITTING DIODE FOR SURFACE MOUNT TECHNOLOGY, METHOD OF MANUFACTURING THE SAME, AND METHOD OF MANUFACTURING LIGHT EMITTING DIODE MODULE

CROSS-REFERENCES TO RELATED APPLICATIONS

This application is a continuation of U.S. patent application Ser. No. 14/677,904, filed on Apr. 2, 2015, which is a continuation of U.S. patent application Ser. No. 14/585,125, filed on Dec. 29, 2014, now issued as U.S. Pat. No. 9,293,660, which is a continuation-in-part of International Application PCT/KR2013/005254, filed on Jun. 14, 2013, and claims priority from and the benefit of Korean Patent Application No. 10-2012-0070129, filed on Jun. 28, 2012, which are all hereby incorporated by references for all purposes as if fully set forth herein.

TECHNICAL FIELD

The present patent document relates to a light emitting diode (LED), including an LED for surface mounting.

BACKGROUND

A light emitting diode (LED) is a device including an n-type semiconductor layer, a p type semiconductor layer, and an active layer interposed between the n type and p type semiconductor layers. When a forward electric field is applied to the n type and p type semiconductor layers, electrons and holes may be injected into the active layer and re-combine in the active layer to emit light.

In addition, an LED may include a reflection layer according to the type of a chip. For example, a flip-chip type is characterized by emitting light through a substrate. Accordingly, after a semiconductor layer is formed on the substrate, a reflection layer formed of or includes a metal is introduced on the semiconductor layer or a current spreading layer, and light is reflected by the reflection layer. Also, a barrier layer is provided on the reflection layer. The barrier layer is provided to prevent diffusion of the metal forming the reflection layer.

SUMMARY

Examples of implementations of the disclosed technology include light emitting diodes (LEDs) and associated methods for fabricating the LEDs and LED modules that include a conductive barrier layer defined by a protective insulating layer.

In some implementations, the disclosed technology can provide an LED including: a substrate, a first semiconductor layer formed on the substrate, an active layer formed on the first semiconductor layer and configured to generate light, a second semiconductor layer formed on the active layer and having a complementary conductive type to the first semiconductor layer, and a reflection pattern formed between protective insulating layers formed on the second semiconductor layer and configured to reflect light generated in the active layer, the reflection pattern having a conductive barrier layer contacting the protective insulating layer.

In some implementations, a method of manufacturing an LED can include: forming a first semiconductor layer, an active layer, a second semiconductor layer, and a protective insulating layer on a substrate, etching the protective insulating layer, the second semiconductor layer, and the active layer and forming a mesa region exposing a surface of the first semiconductor layer, forming photoresist patterns having an overhang structure on the mesa region and etching the protective insulating layer exposed through a space between the photoresist patterns, forming a reflective metal layer on a surface of the second semiconductor layer that is exposed by etching the protective insulating layer, and forming a conductive barrier layer on the reflective metal layer, the conductive barrier layer extending to the protective insulating layer remaining under the photoresist pattern.

In some implementations, a method of manufacturing an LED can include: sequentially forming a first semiconductor layer, an active layer, and a second semiconductor layer on a substrate, etching the second semiconductor layer and the active layer and forming a mesa region exposing a surface of the first semiconductor layer, forming a protective insulating layer on the mesa region and the exposed second semiconductor layer, forming photoresist patterns having an overhang structure on the mesa region and etching the protective insulating layer exposed through a space between the photoresist patterns, forming a reflective metal layer-on a surface of the second semiconductor layer that is exposed by etching the protective insulating layer, and forming a conductive barrier layer on the reflective metal layer, the conductive barrier layer extending to the protective insulating layer remaining under the photoresist pattern.

In some implementations, a method of manufacturing an LED module can include: coating a first insulating layer on a structure in which a first semiconductor layer, an active layer, a second semiconductor layer, and a reflection pattern are formed on a substrate and exposing the reflection pattern and the first semiconductor layer, forming a conductive reflection layer and a reflective barrier layer on the first insulating layer, the reflective barrier layer electrically connected to the first semiconductor layer through the conductive reflection layer and configured to expose the reflection pattern, coating a second insulating layer on the reflective barrier layer to expose the reflection pattern and exposing the reflective barrier layer electrically connected, to the first semiconductor layer, and forming a first pad on the reflective barrier layer and forming a second pad on the reflection pattern.

According to the disclosed technology, protective insulating layers are formed on an emission structure including a first semiconductor layer, an active layer, and a second semiconductor layer, and a reflection pattern including a conductive barrier layer is formed between protective insulating layers.

The reflection pattern can include a reflective metal layer, a stress relaxation layer, and a conductive barrier layer. The conductive barrier layer penetrates into a lower portion of a photoresist pattern having an overhang structure during a forming process. Accordingly, the conductive barrier layer is in contact with a protective insulating layer recessed to a portion of the lower portion of the photoresist pattern. Thus, protrusion of the conductive barrier layer is prevented. Thus, process contamination caused by generation of metal particles and a drop in yield can be prevented.

In addition, a reflective barrier layer can be configured to prevent diffusion of a metallic substance formed on a conductive reflection layer during manufacture of an LED module. The reflective barrier layer can be electrically connected to a first semiconductor layer and electrically connected to a first pad that can be subsequently formed.

Furthermore, a pad barrier layer can be formed on each of pads. Accordingly, permeation or diffusion of metal atoms

BRIEF DESCRIPTION OF DRAWINGS

FIG. 10 is applied, according to a fourth exemplary embodiment of the disclosed technology.

FIG. 10 is applied, according to a fifth exemplary embodiment of the disclosed technology.

DETAILED DESCRIPTION OF THE ILLUSTRATED EMBODIMENTS

Figure 1:
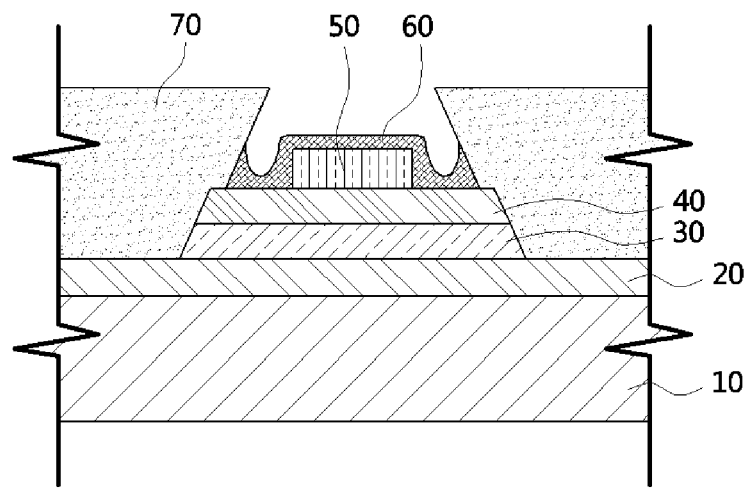
FIGS. 1 and 2 are cross-sectional views of an exemplary light emitting diode (LED) including a reflection layer and a barrier layer.
Figure 2:
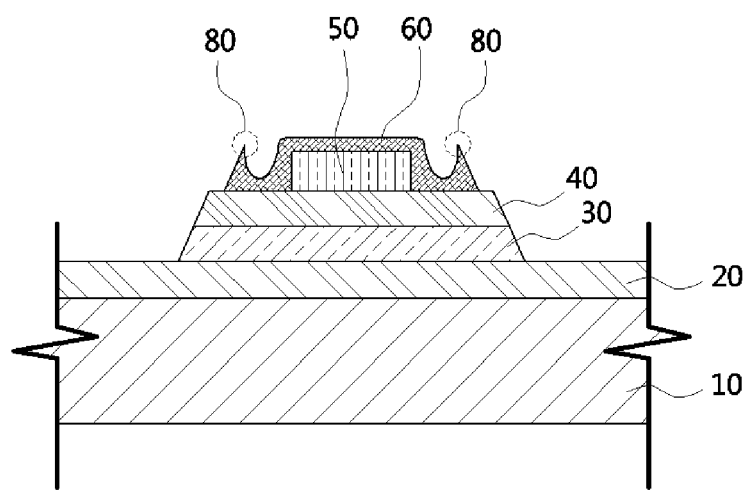

FIGS. 1 and 2 are cross-sectional views of an LED including a reflection layer and a barrier layer.

Referring to FIG. 1, a first semiconductor layer 20, an active layer 30, a second semiconductor layer 40, a reflection layer 50, and a barrier layer 60 are formed on a substrate 10.

The substrate 10 is generally formed of or includes a sapphire material, and the first semiconductor layer 20 is or includes an n type. The active layer 30 having a typical multi-quantum well (MQW) structure is formed on the first semiconductor layer 20. Also, the p type second semiconductor layer 40 is formed on the active layer 30.

The LED having the above-described structure is mesa-etched to expose a top surface of the first semiconductor layer 20. Also, photoresist patterns 70 having an overhang structure is formed on the top surface of the first semiconductor layer 20, which is exposed by mesa-etching.

The second semiconductor layer 40 is exposed in a space in which the photoresist patterns 70 are spaced apart from each other, and the reflection layer 50 is formed on the exposed surface of the second semiconductor layer 40. The reflection layer 50 is or can be formed or disposed using a fabrication process, such as a sputtering procession, on the surface of the second semiconductor layer 40 through the space in which the photoresist patterns 70 are spaced apart from each other. Furthermore, an ohmic contact layer may be additionally formed under the reflection layer 50. The ohmic contact layer may be formed of or include a material selected so as to form an ohmic contact between the reflection layer 50 and the second semiconductor layer 40.

Thereafter, the barrier layer 60 is formed to surround top and side surfaces of the reflection layer 50. The barrier layer 60 may be formed using a sputtering process. The barrier layer 60 functions to prevent diffusion of metal atoms forming the reflection layer 50, and is formed of or include a conductive metal. Since the barrier layer 60 has predetermined diffusivity or isotropic diffusivity due to the sputtering process, the barrier layer 60 surrounds the top and side surfaces of the reflection layer 50 and is also formed on the exposed surface of the second semiconductor layer 40. Also, the barrier layer 60 is accumulated on edge portions of the photoresist patterns 70 having an overhang structure. The barrier layer 60 is adhered to sidewalls of the photoresist pattern 70 and deposited in pointed shapes on the edge portions of the photoresist patterns 70.

Referring to FIG. 2, the photoresist patterns disclosed in FIG. 1 are removed to perform subsequent processes. By removing the photoresist patterns, points 80 of the barrier layer 60 having the pointed shapes are exposed. The exposed points 80 of the barrier layer 60 form fine particles during subsequent processes. Metallic particles increase contamination during subsequent processes and reduce yield.

The disclosed technology provides for a technique of removing the points 80 during the formation of the barrier layer 60 and increasing the yield.

In this patent document when a layer is referred to as being on or over another layer or substrate, the layer can be directly on or over the other layer or substrate or intervening layers may also be present. Terms that describe spatial relationships, such as "on", "upper", "top surface", "under", "lower", "bottom surface" and the like, may be used herein for ease of description to describe one element or feature's relationship to another element(s) or features(s) as illustrated in the Figures. Such terms can represent different orientations of the device in use or operation in addition to the orientations(s) depicted in the Figures. For example, when the device in the Figures is turned over, elements described as "below" or "beneath" other elements or features would then be oriented "above" the other elements or features. Thus, the term "below" can encompass both an orientation of above and below based on a corresponding reference point. The orientation of the device may be changed in other ways (e.g., rotated 90 degrees or some other angle) and spatial relationships described herein should be interpreted within the context of the changed orientation.

It will be understood that, although the terms first, second, etc. may be used herein to describe various elements, these elements should not be limited by these terms and a specific order of the elements is not required.

In the drawings, the thicknesses of layers and regions may be exaggerated for clarity. Like reference numerals refer to like elements throughout.

Embodiment 1

Figure 3:
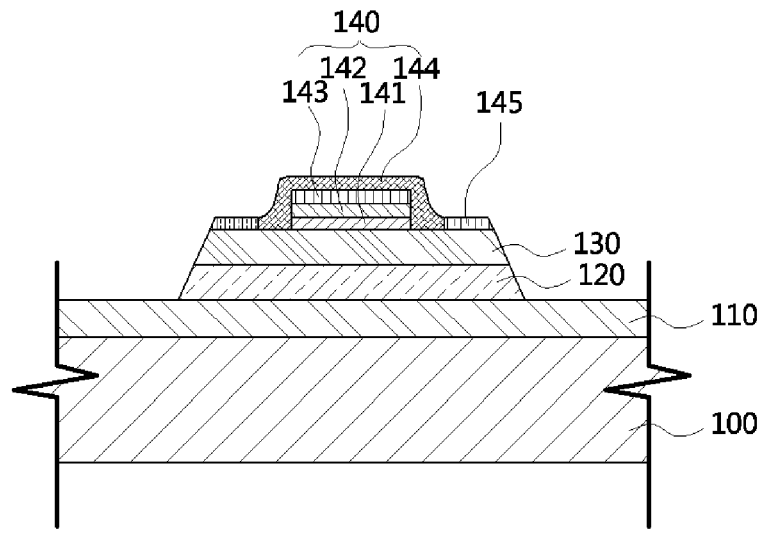
FIG. 3 is a cross-sectional view of an LED according to a first exemplary embodiment of the disclosed technology.

FIG. 3 is a cross-sectional view of a light emitting diode (LED) according to a first exemplary embodiment of the disclosed technology.

Referring to FIG. 3, a first semiconductor layer 110, an active layer 120, a second semiconductor layer 130, and a reflection pattern 140 are formed or disposed on or over a substrate 100.

The substrate 100 may be formed of any material capable of inducing the first semiconductor layer 110 to be grown. Accordingly, the substrate 100 may include sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. Specifically, the substrate 100 may be a sapphire substrate.

Also, the substrate 100 may be a substrate on which surface treatment is not performed. The substrate 100 may be a patterned substrate.

In addition, the first semiconductor layer 110 is provided on the substrate 100. The first semiconductor layer 110 preferably is an n type but can be any conductivity type.

Furthermore, the active layer 120 formed on the first semiconductor layer 110 may have a single quantum well (SQM) structure in which a well layer and a barrier layer are stacked, or an MQW structure in which well layers and barrier layers are alternately stacked.

The second semiconductor layer 130 is provided on the active layer 120. The second semiconductor layer 130 preferably is a p type but can be any conductivity type.

Furthermore, the first semiconductor layer 110, the active layer 120, and the second semiconductor layer 130 may include Si, GaN, AlN, InGaN, or AlInGaN. When the first semiconductor layer 110 includes GaN, the active layer 120 and the second semiconductor layer 130 preferably include GaN. However, since the second semiconductor layer 130 has a complementary or a different conductivity type to the first semiconductor layer 110, a different dopant from that of the first semiconductor layer 110 is introduced into the second semiconductor layer 130. That is, when a dopant serving as a donor is introduced into the first semiconductor layer 110, a dopant serving as an acceptor is introduced into the second semiconductor layer 130. Also, the active layer 120 preferably includes a material on which bandgap engineering is performed to form barrier layers and well layers.

The reflection pattern 140 is formed on or over the second semiconductor layer 130.

The reflection pattern 140 includes an ohmic contact layer 141, a reflective metal layer 142, a stress relaxation layer 143, or a conductive barrier layer 144.

The ohmic contact layer 141 may be formed of or include any material capable of enabling an ohmic contact between the reflective metal layer 142 and the second semiconductor layer 130. Accordingly, the ohmic contact layer 141 may include a metal including nickel (Ni) or platinum (Pt), or include a conductive oxide, such as indium tin oxide (ITO) or zinc oxide (ZnO). However, the ohmic contact layer 141 may be omitted in some embodiments.

The reflective metal layer 142 is formed on or over the ohmic contact layer 141. The reflective metal layer 142 reflects light generated by the active layer 120. Accordingly, the reflective metal layer 142 is formed by selecting a material having conductivity and a high optical reflectance. The reflective metal layer 142 includes Ag, an Ag alloy, Al, or an Al alloy.

In addition, the stress relaxation layer 143 may be formed on the reflective metal layer 142. The stress relaxation layer 143 preferably has a coefficient of thermal expansion equal to or higher than that of the conductive barrier layer 144, and equal to or lower than that of the reflective metal layer 142. Thus, stress caused due to a difference in coefficient of thermal expansion between the reflective metal layer 142 and the conductive barrier layer 144 may be reduced. Accordingly, a material forming the stress relaxation layer 143 may be differently selected according to selected materials forming the reflective metal layer 142 and the conductive barrier layer 144.

However, the ohmic contact layer 141 or the stress relaxation layer 143 may be omitted in some embodiments.

A conductive barrier layer 144 is formed on the reflective metal layer 142 or the stress relaxation layer 143. For example, when the stress relaxation layer 143 is omitted, the conductive barrier layer 144 is formed on or over the reflective metal layer 142. When the stress relaxation layer 143 is formed, the conductive barrier layer 144 is formed on or over the stress relaxation layer 143. The conductive barrier layer 144 is formed to surround at least side surfaces of the reflective metal layer 142 and top and side surfaces of the stress relaxation layer 143. Accordingly, diffusion of metal atoms or ions constituting the reflective metal layer 142 is prevented. Also, stress caused due to a difference in coefficient of thermal expansion between the conductive barrier layer 144 and the reflective metal layer 142 is absorbed in the stress relaxation layer 143.

For example, when the reflective metal layer 142 includes Al or an Al alloy, and the conductive barrier layer 144 includes tungsten (W), titanium tungsten (TiW), or molybdenum (Mo), the stress relaxation layer 143 may be a single layer formed of silver (Ag), copper (Cu), nickel (Ni), platinum (Pt), titanium (Ti), rhodium (Rh), palladium (Pd), or chromium (Cr), or a combination formed of Cu, Ni, Pt, Ti, Rh, Pd or Au. Also, when the reflective metal layer 142 includes Al or an Al alloy, and the conductive barrier layer 144 includes Cr, Pt, Rh, Pd, or Ni, the stress relaxation layer 143 may be a single layer formed of Ag or Cu, or a combination formed of Ni, Au, Cu, or Ag.

Furthermore, when the reflective metal layer 142 includes Ag or an Ag alloy, and the conductive barrier layer 144 includes W, TiW, or Mo, the stress relaxation layer 143 may be a single layer formed of Cu, Ni, Pt, Ti, Rh, Pd, or Cr, or a combination formed of Cu, Ni, Pt, Ti, Rh, Pd, Cr, or Au. Also, when the reflective metal layer 142 includes Ag or an Ag alloy, and the conductive barrier layer 144 includes Cr or Ni, the stress relaxation layer 143 may be a single layer formed of Cu, Cr, Rh, Pd, TiW, or Ti, or a combination formed of Ni, Au, or Cu.

In addition, the conductive barrier layer 144 is formed to coat at least a portion of a surface of the second semiconductor layer 130 and extend to side surfaces of a protective insulating layer 145. However, the conductive barrier layer 144 is or can be preferably formed to contact the side surfaces of the protective insulating layer 145 but not in such a shape as to coat a top surface of the protective insulating layer 145.

FIGS. 4 through 9 are cross-sectional views illustrating a method of manufacturing the LED of FIG. 3, according to a first exemplary embodiment of the disclosed technology.

Figure 4:
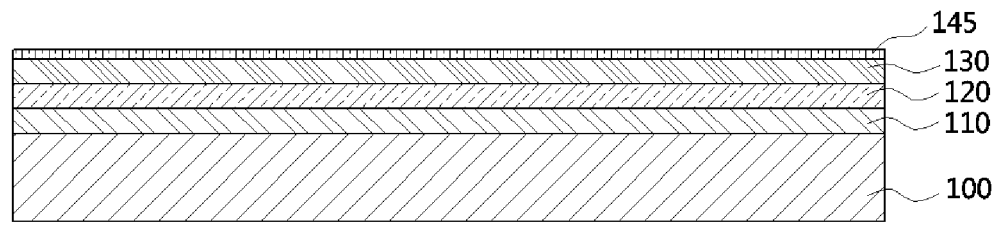
FIGS. 4 through 9 are cross-sectional views illustrating a method of manufacturing the LED of FIG. 3, according to the first exemplary embodiment of the disclosed technology.

Referring to FIG. 4, a first semiconductor layer 110, an active layer 120, a second semiconductor layer 130, and a protective insulating layer 145 are sequentially formed or stacked on or over a substrate 100.

The substrate 100 may include sapphire ($Al_2O_3$), silicon carbide (SIC), gallium nitride (GaN), indium gallium nitride (InGaN), aluminum gallium nitride (AlGaN), aluminum nitride (AlN), gallium oxide ($Ga_2O_3$), or silicon. Specifically, the substrate 100 may be a sapphire substrate. Also, the substrate 100 may be a patterned substrate.

Also, the first semiconductor layer 110 is provided on the substrate 100. The first semiconductor layer 110 preferably includes an n conductivity type but can include any conductivity type layer.

In addition, the active layer 120 formed on the first semiconductor layer 110 may have an SQW structure in which a well layer and a barrier layer are stacked, or an MQW structure in which well layers and barrier layers are alternately stacked.

The second semiconductor layer 130 is provided on the active layer 120. The second semiconductor layer 130 preferably includes a p conductivity type but can include any conductivity type layer.

Furthermore, materials and constructions of the first semiconductor layer 110, the active layer 120, and the second semiconductor layer 130 are or can be the same as described with reference to FIG. 3, and thus a description thereof is omitted.

In addition, in some implementations, the first semiconductor layer 110, the active layer 120, and the second semiconductor layer 130 are formed using an epitaxial growth process. Accordingly, the first semiconductor layer 110, the active layer 120, and the second semiconductor layer 130 are preferably formed using a metal organic chemical vapor deposition (MOCVD) process.

Also, the protective insulating layer 145 is formed on the second semiconductor layer 130. The protective insulating layer 145 may be formed of any insulating material. Accordingly, the protective insulating layer 145 may be formed of silicon oxide or silicon nitride, in addition, the protective insulating layer 145 may be formed of any insulating material having an etch selectivity with respect to the underlying second semiconductor layer 130, active layer 120, or first semiconductor layer 110 and an insulating characteristic.

In addition, the protective insulating layer 145 may be formed using various methods, such as a spin coating process, a physical vapor deposition (PVD) process, a CVD process, or an atomic layer deposit ion (ALD) process.

Figure 5:
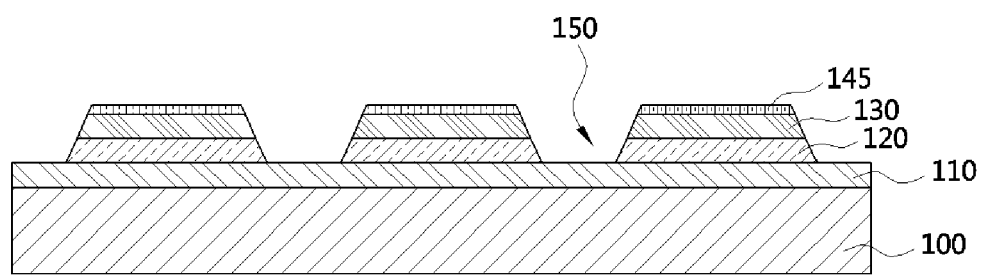

Referring to FIG. 5, portions of the active layer 120, the second semiconductor layer 130, and the protective insulating layer 145 are removed using an ordinary etching process. Thus, a portion of the first semiconductor layer 110 is exposed. Due to the etching process, at least a portion of a top surface of the first semiconductor layer 110 is exposed, at least a portion of side surfaces of the active layer 120 and the second semiconductor layer 130 are exposed, and at least a portion of top and side surfaces of the active layer 120 and the second semiconductor layer 130 are exposed, and at least a portion of top and side surfaces of the protective insulating layer 145 are exposed. Accordingly, a trench or a hole may be formed by removing the portions of the active layer 120, the second semiconductor layer 130, and the protective insulating layer 145 using the etching process. For example, one or more mesa regions 150 etched from the surface of the protective insulating layer 145 of FIG. 5 to the surface of the first semiconductor layer 110 may be a stripe type having a trench shape or a hole type.

In addition, when the mesa region(s) 150 is the stripe type, the mesa region(s) 150 may have a vertical profile or inclined profile with respect to the surface of the first semiconductor layer 110. Preferably, the mesa region(s) 150 has a profile inclined at an angle of about 20° to about 70° with respect to the surface of the first semiconductor layer 110. Also, when the mesa region 150 is a hole type having a roughly circular shape, the mesa region(s) 150 may have a vertical profile or inclined profile with respect to the surface of the first semiconductor layer 110. Preferably, the mesa region(s) 150 has a profile inclined at an angle of about 20° to about 70° with respect to the surface of the first semiconductor layer 110. When the profile is inclined at an angle of less than 20°, a width of the mesa region 150 greatly increases upward. Accordingly, convergence of light generated is degraded due to an emission structure. Also, when the profile is inclined at an angle of more than 70%, the mesa region(s) 150 has an approximately vertical profile. Accordingly, the effect of reflection of generated light by sidewalls of layers become immaterial.

Figure 6:
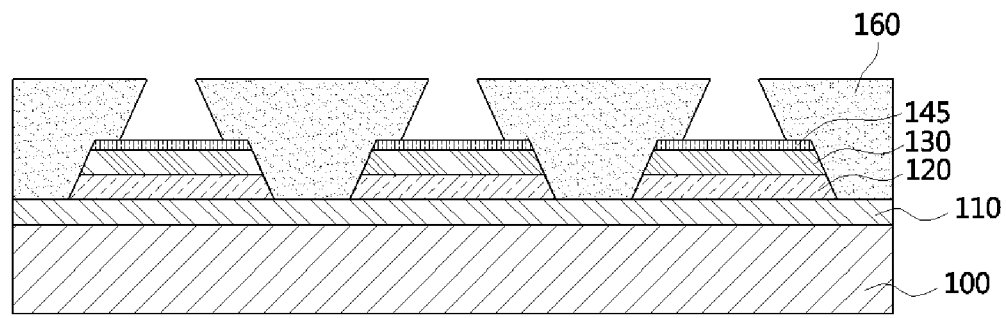

Referring to FIG. 6, a photoresist pattern 160 is formed on the first semiconductor layer 110 exposed by forming a bottom surface of the mesa region(s) 150. The photoresist pattern 160 may have a vertical profile with respect to the surface of the first semiconductor layer 110. In some embodiments, the photoresist pattern 160 may be formed to have an overhang structure having a bottom surface with a smaller width than a top surface thereof. The photoresist pattern 160 is preferably a negative type. Accordingly, exposed portions are cross-linked. To form the overhang structure, the photoresist pattern 160 is preferably exposed at a predetermined angle. In the case of the overhang structure, a distance between bottom surfaces of the photoresist patterns 160 is preferably set to be at least about 1 µm greater than a distance between top surfaces thereof.

Furthermore, the photoresist pattern 160 is preferably provided to cover a portion of the surface of the protective insulating layer 145. Accordingly, the portion of the top surface of the protective insulating layer 145 may remain shielded or protected by the photoresist pattern 160.

Figure 7:
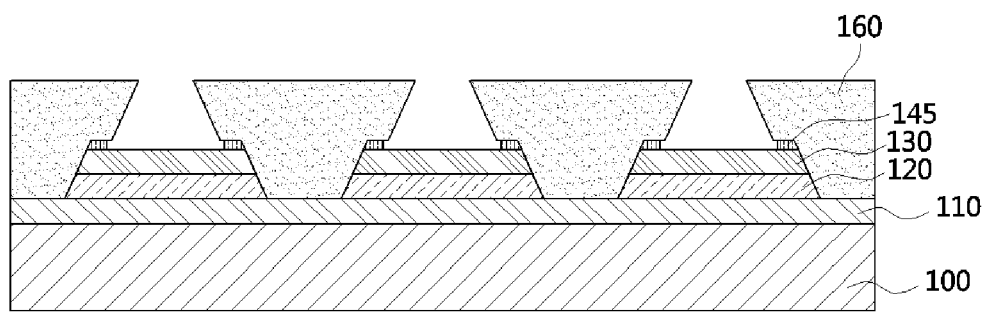

Referring to FIG. 7, an etching process is performed on the protective insulating layer 145 exposed by a space between the photoresist patterns 160. Although the etching process may be performed using a wet process or a dry process, the etching process is preferably performed using a wet etching process. Also, due to the etching process, a large portion of the protective insulating layer 145 formed on the surface of the second semiconductor layer 130 may be removed, and a portion of the surface of the second semiconductor layer 130 is exposed. However, the protective insulating layer 145 formed at corners disposed under the photoresist pattern 160 remains in a recessed space. Accordingly, the recessed space is formed between a lower portion of the photoresist pattern 160 and the second semiconductor layer 130 due to the etching process, and the protective insulating layer 145 remains at an end of the space. Since the wet etching process has isotropic etching characteristics, it may take a considerable amount of time or be troublesome to etch the protective insulating layer 145 formed on the corners disposed under the photoresist pattern 160. Accordingly, the protective insulating layer 145 exposed by the photoresist pattern 160 due to the anisotropic etching process is mostly removed, while only the protective insulating layer 145 recessed under the photoresist pattern 160 remains.

Figure 8:
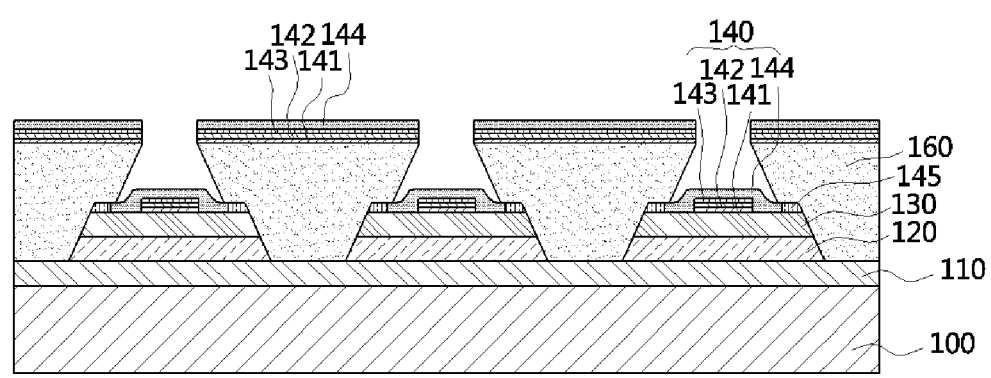

Referring to FIG. 8, a reflective metal layer 142 and a stress relaxation layer 143 are sequentially stacked on the second semiconductor layer 130.

The reflective metal layer 142 includes Al, an Al alloy, Ag, or an Ag alloy. The reflective metal layer 142 may be formed using an ordinary metal deposition process. However, the reflective metal layer 142 is preferably formed using an electronic beam (e-beam) evaporation process capable of moving most metal atoms or ions onto the surface of the second semiconductor layer 130 in a vertical direction. Thus, the metal atoms or ions may have anisotropic etching characteristics and enter a space between the photoresist patterns 160 to form the reflective metal layer 142.

The reflective metal layer 142 preferably has a thickness of about 100 nm to about 1 µm. When the reflective metal layer 142 has a thickness of less than about 100 nm, light generated by the active layer 120 is not smoothly reflected.

Also, when the reflective metal layer 142 has a thickness of more than about 1 μm, process loss may occur due to an excessive process time.

The ohmic contact layer 141 may be formed before forming the reflective metal layer 142, as needed. The ohmic contact layer 141 may include Ni, Pt, ITO, or ZnO. Also, the ohmic contact layer 141 is preferably formed to a thickness of about 0.1 nm to about 20 nm. When the ohmic contact layer 141 has a thickness of less than about 0.1 nm, sufficient ohmic characteristics cannot be ensured due to a very small layer thickness. Also, when the ohmic contact layer 141 has a thickness of more than about 20 nm, the transmitted amount of light is reduced to reduce the quantify of light reflected by the reflective metal layer 142 disposed on the ohmic contact layer 141.

The stress relaxation layer 143 is formed on the reflective metal layer 142.

The stress relaxation layer 143 may be formed using an ordinary metal deposition process, but is preferably formed using an e-beam evaporation method having a high directionality during a deposition process. That is, metal atoms or ions evaporated due to e-beams may have directionality and have anisotropy in a space between the photoresist patterns 160, and the stress relaxation layer 143 may be formed of a metal layer. Also, the stress relaxation layer 143 may have a lower coefficient of thermal expansion than the reflective metal layer 142 and a higher coefficient of thermal expansion than the conductive barrier layer 144 of FIG. 3. Accordingly, a material forming the stress relaxation layer 143 may be differently selected according to selected materials forming the reflective metal layer 142 and the conductive barrier layer 144. The material forming the stress relaxation layer 143 will be described later.

When the reflective metal layer 142 and the stress relaxation layer 143 are formed using an e-beam evaporation method, a side surface of the reflective metal layer 142 and a side surface of the stress relaxation layer 143 are exposed. Also, the reflective metal layer 142 and the stress relaxation layer 143 corresponding to an open upper region of the photoresist pattern 160 are formed using an anisotropic deposition process.

Subsequently, a conductive barrier layer 144 is formed through the opened region of the photoresist pattern 160.

The conductive barrier layer 144 includes W, TiW, Mo, Cr, M, Pi, Rh, Pd, or Ti. In particular, a material forming the conductive barrier layer 144 may be differently selected according to selected materials forming the reflective metal layer 142 and the stress relaxation layer 143.

The conductive barrier layer 144 is formed on the stress relaxation layer 143 and shields at least side surfaces of the reflective metal layer 142 and the stress relaxation layer 143. Accordingly, a metal forming the reflective metal layer 142 is prevented from diffusing into the second semiconductor layer 130 due to lateral diffusion. The formation of the conductive barrier layer 144 is performed using an ordinary metal deposition process. However, the conductive barrier layer 144 is preferably formed using an isotropic etching process. This is because the conductive barrier layer 144 is configured to surround at least the side surfaces of the stress relaxation layer 143 and the reflective metal layer 142. For example, the conductive barrier layer 144 may be formed using a sputtering process.

In addition, the conductive barrier layer 144 may be a single layer formed to a thickness of about 100 nm or more by selecting a specific metal. Also, the conductive barrier layer 144 may be formed by alternately selecting at least two metal materials, and each of layers forming the conductive barrier layer 144 may be formed to a thickness of about 20 nm or more, for example, the conductive barrier layer 144 may be formed by alternately depositing a TiW layer having a thickness of about 50 nm and a Ni layer or Ti layer having a thickness of about 50 nm.

Furthermore, a Ni/Au/Ti layer may be additionally formed on the conductive barrier layer 144 to enable a stable contact of the conductive barrier layer 144 with a subsequent material.

As described above, a material forming the stress relaxation layer 143 may be selected based on materials forming the reflective metal layer 142 and the conductive barrier layer 144. This is at least because a coefficient of thermal expansion of the stress relaxation layer 143 is higher than that of the conductive barrier layer 144 and lower than that of the reflective metal layer 142. Accordingly, when the reflective metal layer 142 includes Al or an Al alloy, and the conductive barrier layer 144 includes W, TiW, or Mo, the stress relaxation layer 143 may be a single layer formed of Ag, Cu, Ni, Pt, Ti, Rh, Pd, or Cr, or a combination formed of Cu, Ni, Pt, Ti, Rh, Pd or Au. Also, when the reflective metal layer 142 includes Al or an Al alloy, and the conductive barrier layer 144 includes Ti, Cr, Pt, Rh, Pd, or Ni, the stress relaxation layer 143 may be a single layer formed of Ag or Cu, or a combination formed of Ni, Au, Cu, or Ag.

Furthermore, when the reflective metal layer 142 includes Ag or an Ag alloy, and the conductive barrier layer 144 includes W, TiW, or Mo, the stress relaxation layer 143 may be a single layer formed of Cu, Ni, Pt, Ti, Rh, Pd, or Cr, or a combination formed of Cu, Ni, Pt, Ti, Rh, Pd, Cr, or Au. Also, when the reflective metal layer 142 includes Ag or an Ag alloy, and the conductive barrier layer 144 includes Cr or Ni, the stress relaxation layer 143 may be a single layer formed of Cu, Cr, Rh, Pd, TiW, or Ti, or a combination formed of Ni, Au, or Cu.

In addition, since the conductive barrier layer 144 is formed using a deposition process, such as a sputtering process, the conductive barrier layer 144 is formed to fill an edge region of the photoresist pattern 160. That is, the conductive barrier layer 144 is formed to fill a space between the photoresist pattern 160 and the second semiconductor layer 130. By filling the space, the protective insulating layer 145 and the conductive barrier layer 144 are physically in contact with each other. Also, due to the deposition process, the conductive barrier layer 144 may be formed along shapes of surfaces of the second semiconductor layer 130, the reflective metal layer 142, and the stress relaxation layer 143.

The ohmic contact layer 141, the reflective metal layer 142, the stress relaxation layer 143, and the conductive barrier layer 144 may be formed also on the photoresist pattern 160.

Figure 9:
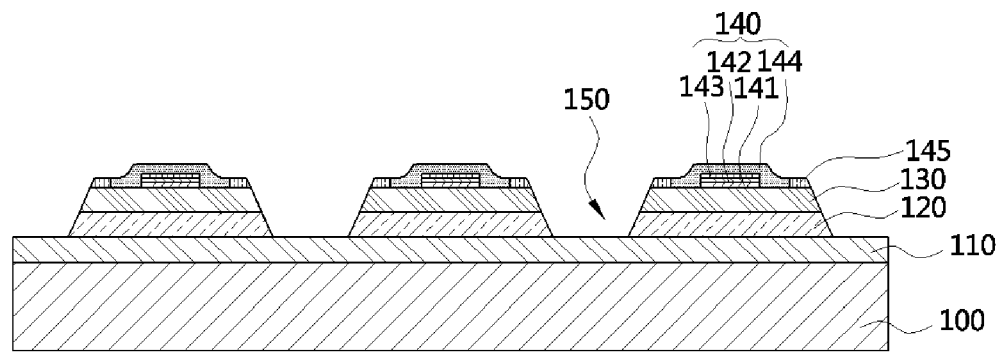

Referring to FIG. 9, a lift-off process is performed on the photoresist pattern 160 to remove the photoresist pattern 160 and the layers disposed thereon. Accordingly, the underlying second semiconductor layer 130 and the reflection pattern 140 disposed thereon are exposed. Also, the mesa region(s) 150 is exposed by removing the photoresist pattern 160. As described above, the mesa region(s) 150 may be a stripe type or a hole type. Also, a protective insulating layer 145 is provided on side surfaces of the reflection pattern 140. The conductive barrier layer 144 of the reflection pattern 140 may be defined by the protective insulating layer 145.

Due to the above-described processes, the reflection pattern 140 is formed on the second semiconductor layer 130. The reflection pattern 140 includes a reflective metal layer 142, a stress relaxation layer 143, and a conductive barrier layer 144. The stress relaxation layer 143 has a lower coefficient of thermal expansion than the reflective metal layer 142 and a higher coefficient of thermal expansion than the conductive barrier layer 144. Accordingly, stress caused due to a difference in coefficient of thermal expansion between the reflective metal layer 142 and the conductive barrier layer 144 is absorbed in the stress relaxation layer 143.

In addition, formation of protruding points shown in FIGS. 1 and 2 is excluded from the conductive barrier layer 144 formed on the reflective metal layer 142 or the stress relaxation layer 143. Accordingly, generation of metal particles is inhibited in subsequent processes to maintain a high yield.

Embodiment 2

Figure 10:
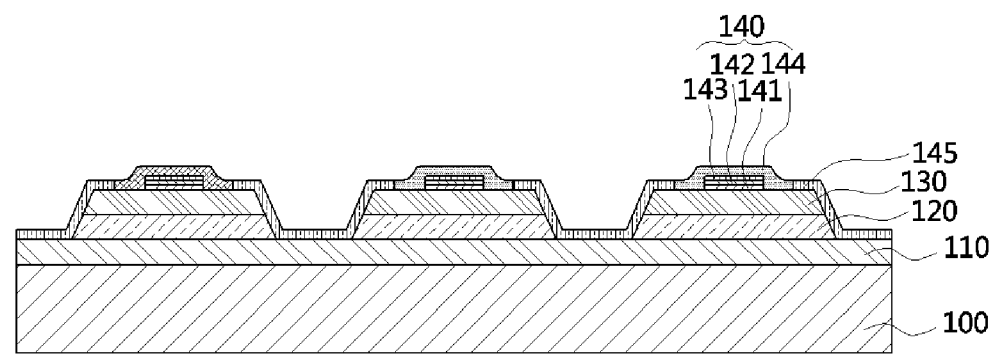
FIG. 10 is a cross-sectional view of an LED according to a second exemplary embodiment of the disclosed technology

FIG. 10 is a cross-sectional view of an LED according to a second exemplary embodiment of the disclosed technology.

Referring to FIG. 10, a first semiconductor layer 110, an active layer 120, a second semiconductor layer 130, a reflection pattern 140, and a protective insulating layer 145 are formed on a substrate 100.

The substrate 100 may be formed of any material capable of inducing the first semiconductor layer 110 to be grown. Accordingly, the substrate 100 may include sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. Specifically, the substrate 100 may be a sapphire substrate.

Also, the substrate 100 may be a substrate on which surface treatment is not performed. The substrate 100 may be a patterned substrate.

In addition, the first semiconductor layer 110 is provided on the substrate 100. The first semiconductor layer 110 preferably includes an n conductivity type but can include any conductivity type layer.

Furthermore, the active layer 120 formed on the first semiconductor layer 110 may have an SQW structure in which a well layer and a barrier layer are stacked, or an MQW structure in which well layers and barrier layers are alternately stacked.

The second semiconductor layer 130 is provided on the active layer 120. The second semiconductor layer 130 preferably has a p conductivity type but can include any conductivity type layer.

Furthermore, the first semiconductor layer 110, the active layer 120, and the second semiconductor layer 130 may include Si, GaN, AlN, InGaN, or AlInGaN. When the first semiconductor layer 110 includes GaN, the active layer 120 and the second semiconductor layer 130 preferably include GaN. However, since the second semiconductor layer 130 has a complementary conductivity type to the first semiconductor layer 110, a different dopant from that of the first semiconductor layer 110 is introduced into the second semiconductor layer 130. That is, when a dopant serving as a donor is introduced into the first semiconductor layer 110, a dopant serving as an acceptor is introduced into the second semiconductor layer 130. Also, the active layer 120 preferably includes a material on which bandgap engineering is performed to form barrier layers and well layers.

The reflection pattern 140 is formed on the second semiconductor layer 130.

The reflection pattern 140 includes an ohmic contact layer 141, a reflective metal layer 142, a stress relaxation layer 143, or a conductive barrier layer 144.

The ohmic contact layer 141 may be formed of any material capable of enabling an ohmic contact between the reflective metal layer 142 and the second semiconductor layer 130. Accordingly, the ohmic contact layer 141 may include a metal including nickel (Ni) or platinum (Pt) or include a conductive oxide, such as indium tin oxide (ITO) or zinc oxide (ZnO). However, the ohmic contact layer 141 may be omitted in some embodiments.

The reflective metal layer 142 is formed on or over the ohmic contact layer 141. The reflective metal layer 142 reflects light generated by the active layer 120. Accordingly, the reflective metal layer 142 is formed by selecting a material having conductivity and a high optical reflectance. The reflective metal layer 142 includes Ag, an Ag alloy, Al, or an Al alloy.

In addition, the stress relaxation layer 143 may be formed on or over the reflective metal layer 142. The stress relaxation layer 143 preferably has a coefficient of thermal expansion equal to or higher than that of the conductive barrier layer 144, and equal to or lower than that of the reflective metal layer 142. Thus, stress caused due to a difference in coefficient of thermal expansion between the reflective metal layer 142 and the conductive barrier layer 144 may be reduced. Accordingly, a material forming the stress relaxation layer 143 may be differently selected according to selected materials forming the reflective metal layer 142 and the conductive barrier layer 144.

However, the ohmic contact layer 141 or the stress relaxation layer 143 may be omitted in some embodiments.

A conductive barrier layer 144 is formed on or over the reflective metal layer 142 or the stress relaxation layer 143. For example, when the stress relaxation layer 143 is omitted, the conductive barrier layer 144 is formed on the reflective metal layer 142. When the stress relaxation layer 143 is formed, the conductive barrier layer 144 is formed on the stress relaxation layer 143. The conductive barrier layer 144 is formed to surround at least side surfaces of the reflective metal layer 142 and top and side surfaces of the stress relaxation layer 143. Accordingly, diffusion of metal atoms or ions constituting the reflective metal layer 142 is prevented. Also, stress caused due to a difference in coefficient of thermal expansion between the conductive barrier layer 144 and the reflective metal layer 142 is absorbed in the stress relaxation layer 143.

For example, when the reflective metal layer 142 includes Al or an Al alloy, and the conductive barrier layer 144 includes W, TiW, or Mo, the stress relaxation layer 143 may be a single layer formed of Ag, Cu, Ni, Pt, Ti, Rh, Pd, or Cr, or a combination formed of Cu, Ni, Pt, Ti, Rh, Pd or Au. Also, when the reflective metal layer 142 includes Al or an Al alloy, and the conductive barrier layer 144 includes Cr, Pt, Rh, Pd, or Ni, the stress relaxation layer 143 may be a single layer formed of Ag or Cu, or a combination of Ni, Au, Cu, or Ag.

Furthermore, when the reflective metal layer 142 includes Ag or an Ag alloy, and the conductive barrier layer 144 includes W, TiW, or Mo, the stress relaxation layer 143 may be a single layer formed of Cu, Ni, Pt, Ti, Rh, Pd, or Cr, or a combination formed of Cu, Ni, Pt, Ti, Rh, Pd, Cr, or Au. Also, when the reflective metal layer 142 includes Ag or an Ag alloy, and the conductive barrier layer 144 includes Cr or Ni, the stress relaxation layer 143 may be a single layer formed of Cu, Cr, Rh, Pd, TiW, or Ti, or a combination of Ni, Au, or Cu.

In addition, the conductive barrier layer 144 is formed to coat a surface of the second semiconductor layer 130 and extend to at least side surfaces of a protective insulating layer 145. However, the conductive barrier layer 144 is preferably formed to contact the side surfaces of the protective insulating layer 145 but not in such a shape as to coat a top surface of the protective insulating layer 145.

In FIG. 10, the protective insulating layer 145 is formed to completely coat a portion of a top surface of the second semiconductor layer 130 and the mesa region 150. That is, the protective insulating layer 145 coats a surface of the first semiconductor layer 110 and portions of side and top surfaces of the active layer 120 and the second semiconductor layer 130, which are exposed by mesa-etching.

FIGS. 11 through 16 are cross-sectional views illustrating a method of manufacturing the LED of FIG. 10, according to a second exemplary embodiment of the disclosed technology.

Figure 11:
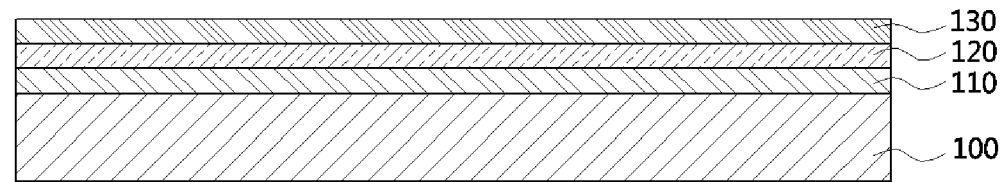
FIGS. 11 through 16 are cross-sectional views illustrating a method of manufacturing the LED of FIG. 10, according to the second exemplary embodiment of the disclosed technology.

Referring to FIG. 11, a first semiconductor layer 110, an active layer 120, and a second semiconductor layer 130 are sequentially formed on a substrate 100.

Furthermore, materials and forming methods of the first semiconductor layer 110, the active layer 120, and the second semiconductor layer 130 are the same as described in Embodiment 1, and thus a description thereof is omitted.

Figure 12:
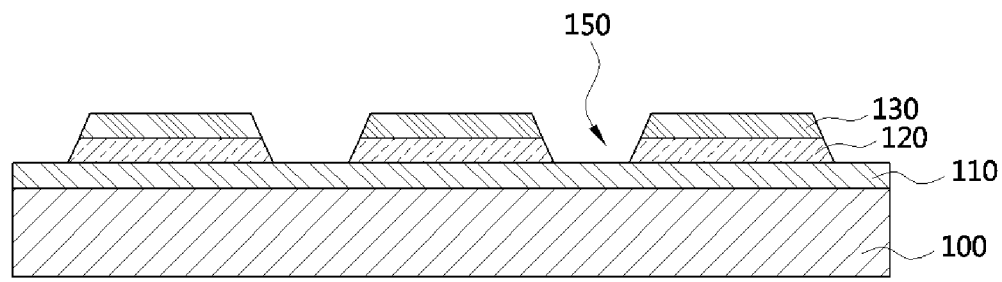

Referring to FIG. 12, portions of the active layer 120 and the second semiconductor layer 130 are removed using an ordinary etching process. Thus, a portion of the first semiconductor layer 110 is exposed. Due to the etching process, a top surface of the first semiconductor layer 110 is exposed, and side surfaces of the active layer 120 and the second semiconductor layer 130 are exposed. Accordingly, a mesa region 150 or a hole may be formed by removing the portions of the active layer 120 and the second semiconductor layer 130 using the etching process. That is, the mesa region 150 etched from the surface of the second semiconductor layer 130 of FIG. 11 to the surface of the first semiconductor layer 110 may be a stripe type having a trench shape or a hole type.

In addition, when the mesa region 150 is the stripe type, the mesa region 150 may have a vertical profile or inclined profile with respect to the surface of the first semiconductor layer 110. Preferably, the mesa region 150 has a profile inclined at an angle of about 20° to about 70° with respect to the surface of the first semiconductor layer 110. Also, when the mesa region 150 is a hole type having a roughly circular shape, the mesa region 150 may have a vertical profile or inclined profile with respect to the surface of the first semiconductor layer 110. Preferably, the mesa region 150 has a profile inclined at an angle of about 20° to about 70° with respect to the surface of the first semiconductor layer 110. When the profile is inclined at an angle of less than 20°, a width of the mesa region 150 greatly increases upward. Accordingly, convergence of light generated is degraded due to an emission structure. Also, when the profile is inclined at an angle of more than 70°, the mesa region 150 has an approximately vertical profile. Accordingly, the effect of reflection of generated light by sidewalls of layers become immaterial.

Figure 13:
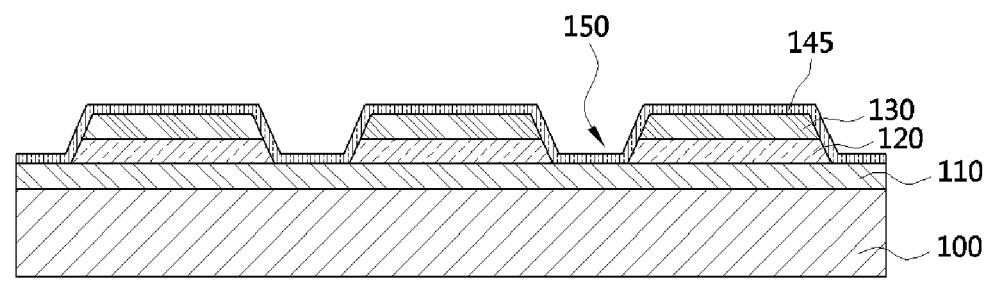

Referring to FIG. 13, a protective insulating layer 145 is formed on the entire surface of the resultant structure shown in FIG. 12.

The protective insulating layer 145 may be formed of any insulating material. Accordingly, the protective insulating layer 145 may be formed of silicon oxide or silicon nitride. In addition, the protective insulating layer 145 may be formed of any insulating material having an etch selectivity with respect to the underlying second semiconductor layer 130, active layer 120, or first semiconductor layer 110 and an insulating characteristic.

The protective insulating layer 145 may be formed using a spin coating process, a PVD process, a CVD process, or an ALD process according to a used material.

Figure 14:
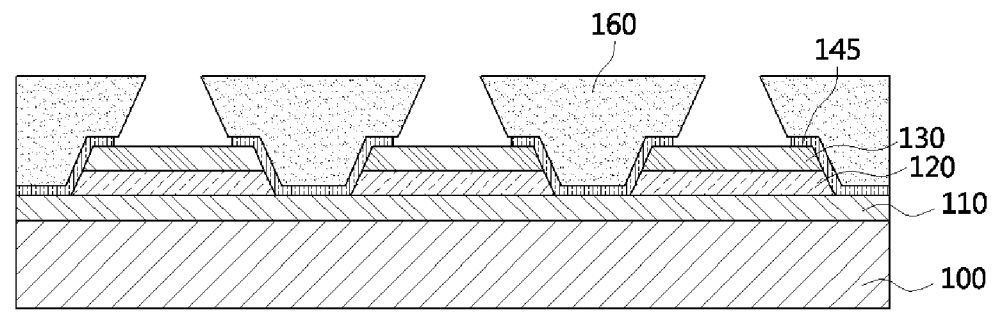

Referring to FIG. 14, a photoresist pattern 160 is formed on the exposed protective insulating layer 145, which forms a bottom surface of the mesa region 150. The photoresist pattern 160 may have a vertical profile with respect to the surface of the protective insulating layer 145 disposed on the mesa region 150. In some embodiments, the photoresist pattern 160 may be formed to have an overhang structure having a bottom surface with a smaller width than a top surface thereof. The photoresist pattern 160 is preferably a negative type. Accordingly, exposed portions are cross-linked. To form the overhang structure, the photoresist pattern 160 is preferably exposed at a predetermined angle. In the case of the overhang structure, a distance between bottom surfaces of the photoresist patterns 160 is preferably set to be at least about 1 μm greater than a distance between top surfaces thereof.

Furthermore, the protective insulating layer 145 disposed on the second semiconductor layer 130 is exposed through the space between the photoresist patterns 160. Subsequently, an etching process is performed on the protective insulating layer 145 exposed through the space between the photoresist patterns 160.

Although the etching process may be performed using a wet process or a dry process, the etching process is preferably performed using a wet etching process. Also, due to the etching process, a large portion of the protective insulating layer 145 formed on or over the surface of the second semiconductor layer 130 may be removed, and a portion of the surface of the second semiconductor layer 130 is exposed. However, the protective insulating layer 145 formed at corners disposed under the photoresist pattern 160 remains. Accordingly, a space is formed between a lower portion of the photoresist pattern 160 and the second semiconductor layer 130 due to the etching process, and the protective insulating layer 145 remains at an end of the space. Since the wet etching process has isotropic etching characteristics, it may take a considerable amount of time or be troublesome to etch the protective insulating layer 145 formed on the corners disposed under the photoresist pattern 160. Accordingly, the protective insulating layer 145 exposed by the photoresist pattern 160 due to the anisotropic etching process is mostly removed, while only the protective insulating layer 145 recessed under the photoresist pattern 160 remains.

Figure 15:
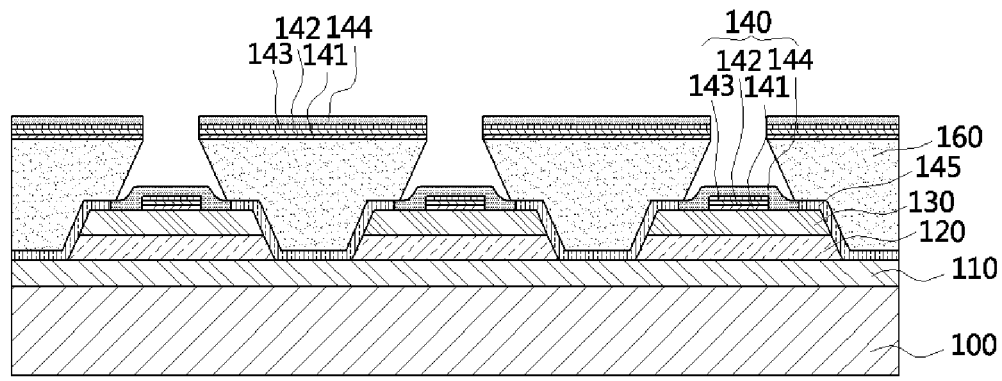

Referring to FIG. 15, a reflective metal layer 142, a stress relaxation layer 143, and a conductive barrier layer 144 are sequentially stacked on the second semiconductor layer 130 exposed by etching.

The reflective metal layer 142 includes Al, an Al alloy, Ag, or an Ag alloy. The reflective metal layer 142 may be formed using an ordinary metal deposition process. However, the reflective metal layer 142 is preferably formed using an electronic beam (e-beam) evaporation process capable of moving most metal atoms of ions onto the surface of the second semiconductor layer 130 in a vertical direction. Thus, the metal atoms or ions may have anisotropic etching characteristics and enter a space between the photoresist patterns 160 to form the reflective metal layer 142.

The reflective metal layer 142 preferably has a thickness of about 100 nm to about 1 μm. When the reflective metal layer 142 has a thickness of less than about 100 nm, light generated by the active layer 120 is not smoothly reflected. Also, when the reflective metal layer 142 has a thickness of more than about 1 µm, process loss may occur due to an excessive process time.

The ohmic contact layer 141 may be formed before forming the reflective metal layer 142, as needed. The ohmic contact layer 141 may include Ni, Pt, ITO, or ZnO. Also, the ohmic contact layer 141 is preferably formed to a thickness of about 0.1 nm to about 20 nm. When the ohmic contact layer 141 has a thickness of less than about 0.1 nm, sufficient ohmic characteristics cannot be ensured due to a very small layer thickness. Also, when the ohmic contact layer 141 has a thickness of more than about 20 nm, the transmitted amount of light is reduced to reduce the quantity of light reflected by the reflective metal layer 142 disposed on the ohmic contact layer 141.

The stress relaxation layer 143 is formed on the reflective metal layer 142.

The stress relaxation layer 143 may be formed using an ordinary metal deposition process, but is preferably formed using an e-beam evaporation method having a high directionality during a deposition process. That is, metal atoms or ions evaporated due to e-beams may have directionality and have anisotropy in a space between the photoresist patterns 160, and the stress relaxation layer 143 may be formed of a metal layer. Also, the stress relaxation layer 143 may have a lower coefficient of thermal expansion than the reflective metal layer 142 and a higher coefficient of thermal expansion than the conductive barrier layer 144 of FIG. 3. Accordingly, a material forming the stress relaxation layer 143 may be differently selected according to selected materials forming the reflective metal layer 142 and the conductive barrier layer 144. The material forming the stress relaxation layer 143 will be described later.

When the reflective metal layer 142 and the stress relaxation layer 143 are formed using an e-beam evaporation method, a side surface of the reflective metal layer 142 and a side surface of the stress relaxation layer 143 are exposed. Also, the reflective metal layer 142 and the stress relaxation layer 143 corresponding to an open upper region of the photoresist pattern 160 are formed using an anisotropic deposition process.

Subsequently, a conductive barrier layer 144 is formed through the opened region of the photoresist pattern 160.

The conductive barrier layer 144 includes W, TiW, Mo, Cr, Ni, Pt, Rh, Pd, or Ti. In particular, a material forming the conductive barrier layer 144 may be differently selected according to selected materials forming the reflective metal layer 142 and the stress relaxation layer 143.

The conductive barrier layer 144 is formed on or over the stress relaxation layer 143 and shields at least side surfaces of the reflective metal layer 142 and the stress relaxation layer 143. Accordingly, a metal forming the reflective metal layer 142 is prevented from diffusing into the second semiconductor layer 130 due to lateral diffusion. The formation of the conductive barrier layer 144 is performed using an ordinary metal de-position process. However, the conductive barrier layer 144 is preferably formed using an isotropic etching process. This is at least because the conductive barrier layer 144 is configured to surround at least the side surfaces of the stress relaxation layer 143 and the reflective metal layer 142. For example, the conductive barrier layer 144 may be formed using a sputtering process.

In addition, the conductive barrier layer 144 may be a single layer formed to a thickness of about 100 nm or more by selecting a specific metal. Also, the conductive barrier layer 144 may be formed by alternately selecting at least two metal materials, and each of layers forming the conductive barrier layer 144 may be formed to a thickness of about 20 nm or more. For example, the conductive barrier layer 144 may be formed by alternately depositing a TiW layer having a thickness of about 50 nm and a Ni layer or Ti layer having a thickness of about 50 nm.

Furthermore, a Ni/Au/Ti layer may be additionally formed on the conductive barrier layer 144 to enable a stable contact of the conductive barrier layer 144 with a subsequent material.

As described above, a material forming the stress relaxation layer 143 may be selected based on materials forming the reflective metal layer 142 and the conductive barrier layer 144. This is at least because a coefficient of thermal expansion of the stress relaxation layer 143 is higher than that of the conductive barrier layer 144 and lower than that of the reflective metal layer 142. Accordingly, when the reflective metal layer 142 includes Al or an Al alloy, and the conductive barrier layer 144 includes W, TiW, or Mo, the stress relaxation layer 143 may be a single layer formed of Ag, Cu, Ni, Pt, Ti, Rh, Pd, or Cr, or a combination formed of Cu, Ni, Ft, Ti, Rh, Pd or Au. Also, when the reflective metal layer 142 includes Al or an Al alloy, and the conductive barrier layer 144 includes Ti, Cr, Pt, Rh, Pd, or Ni, the stress relaxation layer 143 may be a single layer formed of Ag or Cu, or a combination formed of Ni, Au, Cu, or Ag. Furthermore, when the reflective metal layer 142 includes Ag or an Ag alloy, and the conductive barrier layer 144 includes W, TiW, or Mo, the stress relaxation layer 143 may be a single layer formed of Cu, Ni, Pt, Ti, Rh, Pd, or Cr, or a combination formed of Cu, Ni, Pt, Ti, Rh, Pd, Cr, or Au. Also, when the reflective metal layer 142 includes Ag or an Ag alloy, and the conductive barrier layer 144 includes Pt or Ni, the stress relaxation layer 143 may be a single layer formed of Cu, Cr, Rh, Pd, TiW, or Ti, or a combination formed of Ni, Au, or Cu.

In addition, since the conductive barrier layer 144 is formed using a deposition process, such as a sputtering process, the conductive barrier layer 144 is formed to fill an edge region of the photoresist pattern 160. That is, the conductive barrier layer 144 is formed to fill a space between the photoresist pattern 160 and the second semiconductor layer 130. By filling the space, the protective insulating layer 145 and the conductive barrier layer 144 are physically in contact with each other. Also, due to the deposition process, the conductive barrier layer 144 may be formed along shapes of surfaces of the second semiconductor layer 130, the reflective metal layer 142, and the stress relaxation layer 143.

The ohmic contact layer 141, the reflective metal layer 142, the stress relaxation layer 143, and the conductive barrier layer 144 may be formed also on the photoresist pattern 160.

Figure 16:
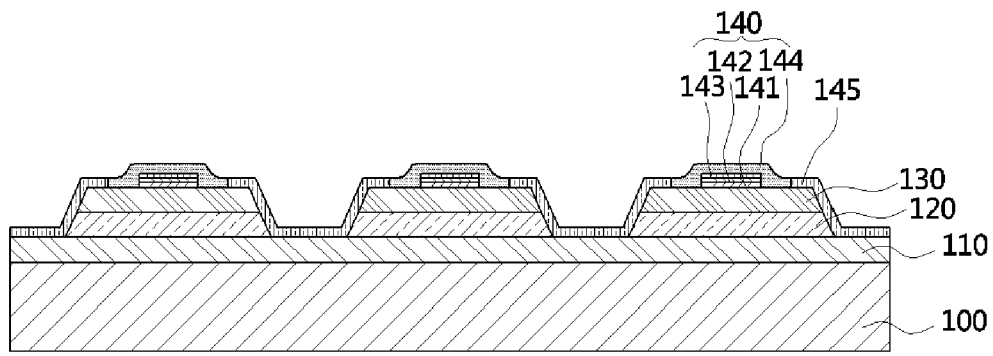

Referring to FIG. 16, a lift-off process is performed on the photoresist pattern 160 to remove the photoresist pattern 160 and the layers disposed thereon. Accordingly, the protective insulating layer 145 coated on the mesa region(s) 150 and the reflection pattern 140 disposed thereon are exposed. As described above/the mesa region(s) 150 may be a stripe type or a hole type. Also, a protective insulating layer 145 is provided on side surfaces of the reflection pattern 140 and the mesa region(s) 150. The conductive barrier layer 144 of the reflection pattern 140 may be defined by the protective insulating layer 145.

Due to the above-described processes, the reflection pattern 140 is formed on or over the second semiconductor layer 130. The reflection pattern 140 includes a reflective metal layer 142, a stress relaxation layer 143, and a conductive barrier layer 144. The stress relaxation layer 143 has a lower coefficient of thermal expansion than the reflective metal layer 142 and a higher coefficient of thermal expansion than the conductive barrier layer 144. Accordingly, stress caused due to a difference in coefficient of thermal expansion between the reflective metal layer 142 and the conductive barrier layer 144 is absorbed in the stress relaxation layer 143.

In addition, formation of protruding points shown in FIGS. 1 and 2 is excluded from the conductive barrier layer 144 formed on the reflective metal layer 142 or the stress relaxation layer 143. Accordingly, generation of metal particles is inhibited in subsequent processes to maintain a high yield.

Embodiment 3

Figure 17:
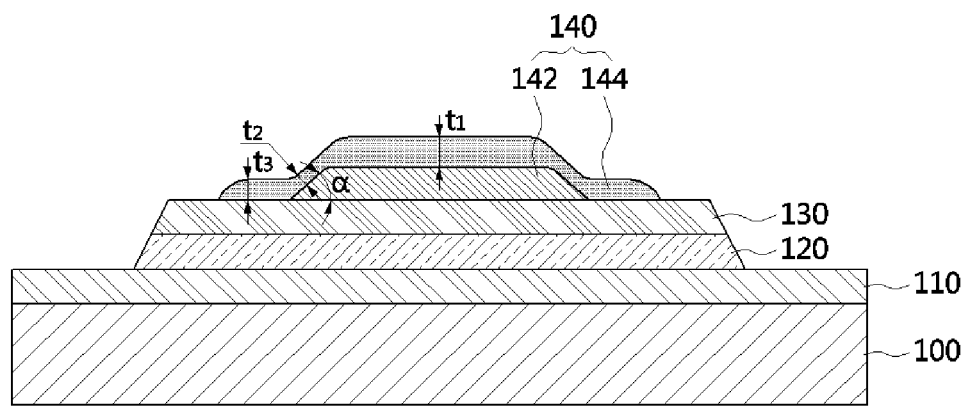
FIG. 17 is a cross-sectional view of an LED according to a third exemplary embodiment of the disclosed technology.

FIG. 17 is a cross-sectional view of an LED according to a third exemplary embodiment of the disclosed technology.

Referring to FIG. 17, a first semiconductor layer 110, an active layer 120, a second semiconductor layer 130, and a reflection pattern 140 are formed on or over a substrate 100.

The substrate 100 may be formed of any material capable of inducing the first semiconductor layer 110 to be grown. Accordingly, the substrate 100 may include sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. Specifically, the substrate 100 may be a sapphire substrate.

Also, the substrate 100 may be a substrate on which surface treatment is not performed. The substrate 100 may be a patterned substrate. Also, the substrate 100 may have a surface having a moth-eye structure. For example, the substrate 100 may have a protrusion protruding in a roughly hemispherical shape, and pointed structures may be densely disposed on the protrusion.

In addition, the first semiconductor layer 110 is provided on the substrate 100. The first semiconductor layer 110 preferably includes an n conductivity type but can include any conductivity type layer.

Furthermore, the active layer 120 formed on the first semiconductor layer 110 may have an SQW structure in which a well layer and a barrier layer are stacked, or an MQW structure in which well layers and barrier layers are alternately stacked.

The second semiconductor layer 130 is provided on the active layer 120. The second semiconductor layer 130 preferably includes a p conductivity type but can include any conductivity type layer.

Furthermore, the first semiconductor layer 110, the active layer 120, and the second semiconductor layer 130 may include Si, GaN, AlN, InGaN, or AlInGaN. When the first semiconductor layer 110 includes GaN, the active layer 120 and the second semiconductor layer 130 preferably include GaN. However, since the second semiconductor layer 130 has a complementary or different conductivity type to the first semiconductor layer 110, a different dopant from that of the first semiconductor layer 110 is introduced into the second semiconductor layer 130. That is, when a dopant serving as a donor is introduced into the first semiconductor layer 110, a dopant serving as an acceptor is introduced into the second semiconductor layer 130. Also, the active layer 120 preferably includes a material on which bandgap engineering is performed to form barrier layers and well layers.

The reflection pattern 140 is formed on the second semiconductor layer 130.

The reflection pattern 140 includes a reflective metal layer 142 and a conductive barrier layer 144. Also, in some embodiments, an ohmic contact layer (not shown) may be formed under the reflective metal layer 142, and a stress relaxation layer (not shown) may be additionally formed between the reflective metal layer 142 and the conductive barrier layer 144.

An ohmic contact layer may be formed of any material capable of enabling an ohmic contact between the reflective metal layer 142 and the second semiconductor layer 130. Accordingly, the ohmic contact layer may include a metal including Ni or Pt or include a conductive oxide, such as ITO or ZnO. However, the ohmic contact layer may be omitted in some embodiments.

The reflective metal layer 142 is formed on or over the ohmic contact layer. The reflective metal layer 342 reflects light generated by the active layer 120. Accordingly, the reflective metal layer 142 is formed by selecting a material having conductivity and a high optical reflectance. The reflective metal layer 142 includes Ag, an Ag alloy, Al, or an Al alloy.

In addition, a stress relaxation layer 143 may be formed on or over the reflective metal layer 142. The stress relaxation layer 143 preferably has a coefficient of thermal expansion equal to or higher than that of the conductive barrier layer 144, and equal to or lower than that of the reflective metal layer 142. Thus, stress caused due to a difference in coefficient of thermal expansion between the reflective metal layer 142 and the conductive barrier layer 144 may be reduced. Accordingly, a material forming the stress relaxation layer 143 may be differently selected according to selected materials forming the reflective metal layer 142 and the conductive barrier layer 144.

However, the ohmic contact layer or the stress relaxation layer may be omitted in some embodiments.

In addition, an angle 'a' formed by the reflective metal layer 142 with a plane surface of the underlying second semiconductor layer 130 preferably ranges from about 5° to about 45°. When an angle 'α' formed by a side surface of the reflective metal layer 142 is less than about 5°, it is difficult to ensure a sufficient thickness of the reflective metal layer 142. When an angle α formed by the side surface of the reflective metal layer 142 is more than about 45°, cracks occur in a side profile of the conductive barrier layer 144 formed on the reflective metal layer 142. When an ohmic contact layer is introduced, an inclination angle formed by the ohmic contact layer with the side surface of the reflective metal layer 142 should be within the above-described angle range.

The conductive barrier layer 144 is formed on or over the reflective metal layer 142 or the stress relaxation layer 143. For example, when a stress relaxation layer 143 is omitted, the conductive barrier layer 144 is formed on or over the reflective metal layer 142, and when the stress relaxation layer is formed, the conductive barrier layer 144 is formed on or over the stress relaxation layer 143. The conductive barrier layer 144 is formed to surround at least the side surface of the reflective metal layer 142 and surround top and side surfaces of the stress relaxation layer 143. Accordingly, diffusion of metal atoms or ions constituting the reflective metal layer 142 is prevented. Also, stress caused due to a difference in coefficient of thermal expansion between the conductive barrier layer 144 and the reflective metal layer 142 may be absorbed in the stress relaxation layer 143. In particular, the conductive barrier layer 144 may be formed to a different thickness according to a surface state of the underlying reflective metal layer 142 or stress relaxation layer 143. For example, assuming that the thickness of the conductive barrier layer 144 formed on a top surface of the reflective metal layer 142 is t1, the thickness of the conductive barrier layer 144 formed on the side surface of the reflective metal layer 142 is t2, and the thickness of the conductive barrier layer 144 formed on the surface of the second semiconductor layer 130 is t3, a relationship of t1>t3>t2 is preferably set.

In addition, the conductive barrier layer 144 is formed to completely shield the reflective metal layer 142 or the stress relaxation layer 143 and extend to the surface of the second semiconductor layer 130.

In addition, when the reflective metal layer 142 includes Al or an Al alloy, and the conductive barrier layer 144 includes W, TiW, or Mo, the stress relaxation layer 143 may be a single layer formed of Ag, Cu, Ni, Pt, Ti, Rh, Pd, or Cr, or a combination formed of Cu, Ni, Pt, Ti, Rh, Pd or An. Also, when the reflective metal layer 142 includes Al or an Al alloy, and the conductive barrier layer 144 includes Ti, Cr, Pt, Rh, Pd, or Ni, the stress relaxation layer 143 may be a single layer formed of Ag or Cu, or a combination formed of Ni, An, Cu, or Ag.

Furthermore, when the reflective metal layer 142 includes Ag or an Ag alloy, and the conductive barrier layer 144 includes W, TiW, or Mo, the stress relaxation layer 143 may be a single layer formed of Cu, Ni, Pt, Ti, Rh, Pd, or Cr, or a combination formed of Cu, Ni, Pt, Ti, Rh, Pd, Cr, or Au. Also, when the reflective metal layer 142 includes Ag or an Ag alloy, and the conductive barrier layer 144 includes Cr or Ni, the stress relaxation layer 143 may be a single layer formed of Cu, Cr, Rh, Pd/TiW, or Ti, or a combination formed of Ni, An, or Cu.

In addition, the conductive barrier layer 144 coats at least a portion of a surface of the second semiconductor layer 130.

FIGS. 18 through 22 are cross-sectional views illustrating a method of manufacturing the LED of FIG. 17, according to a third exemplary embodiment of the disclosed technology.

Figure 18:
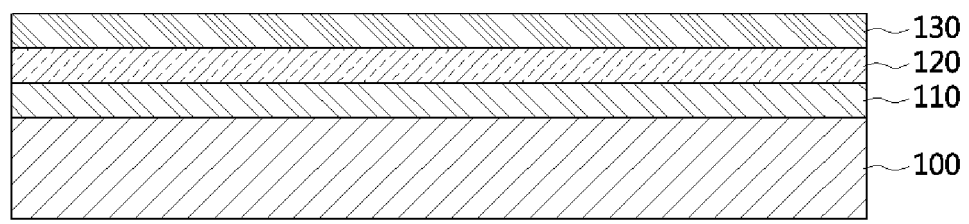
FIGS. 18 through 22 are cross-sectional views illustrating a method of manufacturing the LED of FIG. 17, according to the third exemplary embodiment of the disclosed technology.

Referring to FIG. 18, a first semiconductor layer 110, an active layer 120, and a second semiconductor layer 130 are sequentially formed or stacked on or over a substrate 100.

The substrate 100 may include sapphire ($Al_2O_3$), silicon carbide (SiC), gallium nitride (GaN), indium gallium nitride (InGaN), aluminum gallium nitride (AlGaN), aluminum nitride (AlN), gallium oxide ($Ga_2O_3$), or silicon. Specifically, the substrate 100 may be a sapphire substrate. Also, the substrate 100 may be a patterned substrate or a substrate having a surface with a moth-eye structure.

Also, the first semiconductor layer 110 is provided on the substrate 100. The first semiconductor layer 110 preferably includes an n conductivity type but can include any conductivity type layer.

In addition, the active layer 120 formed on or over the first semiconductor layer 110 may have an SQW structure in which a well layer and a barrier layer are stacked, or an MQW structure in which well layers and barrier layers are alternately stacked.

The second semiconductor layer 130 is provided on or over the active layer 120. The second semiconductor layer 130 preferably includes a p conductivity type but can include any conductivity type layer.

Furthermore, materials and constructions of the first semiconductor layer 110, the active layer 120, and the second semiconductor layer 130 are substantially the same as described with reference to FIG. 3, and thus a description thereof is omitted.

In addition, the first semiconductor layer 110, the active layer 120, and the second semiconductor layer 130 are formed using an epitaxial growth process. Accordingly, the first semiconductor layer 110, the active layer 120, and the second semiconductor layer 130 are preferably formed using an MOCVD process.

Figure 19:
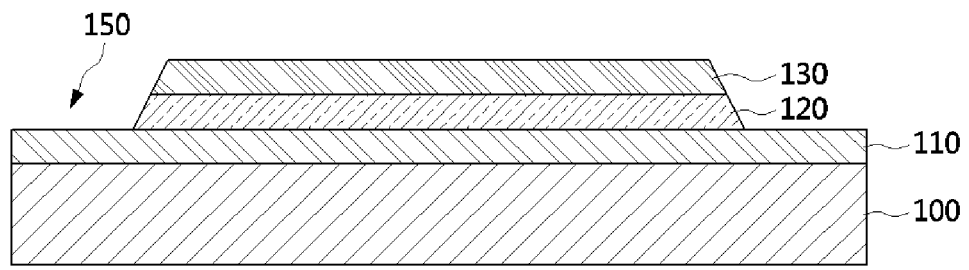

Referring to FIG. 19, portions of the active layer 120 and the second semiconductor layer 130 are removed using an ordinary etching process. Thus, a portion of the first semiconductor layer 110 is exposed. Due to the etching process, a top surface of the first semiconductor layer 110 is exposed, and side surfaces of the active layer 120 and the second semiconductor layer 130 are exposed. Accordingly, a trench or a hole may be formed by removing the portions of the active layer 120 and the second semiconductor layer 130 using the etching process. That is, a mesa region(s) 150 etched from the surface of the second semiconductor layer 130 of FIG. 5 to the surface of the first semiconductor layer 110 may be a stripe type having a trench shape or a hole type.

In addition, when the mesa region(s) 150 is the stripe type, the mesa region(s) 150 may have a vertical profile or inclined profile with respect to the surface of the first semiconductor layer 110. Preferably, the mesa region(s) 150 has a profile inclined at an angle of about 20° to about 70° with respect to the surface of the first semiconductor layer 110. Also, when the mesa region(s) 150 is or can include a hole type having a roughly circular shape, the mesa region(s) 150 may have a vertical profile or inclined profile with respect to the surface of the first semiconductor layer 110. Preferably, the mesa region(s) 150 has a profile inclined at an angle of about 20° to about 70° with respect to the surface of the first semiconductor layer 110. When the profile is inclined at an angle of less than 20°, a width of the mesa region 150 greatly increases upward. Accordingly, convergence of light generated is degraded due to an emission structure. Also, when the profile is inclined at an angle of more than 70°, the mesa region 150 has an approximately vertical profile. Accordingly, the effect of reflection of generated light by sidewalls of layers become immaterial.

Figure 20:
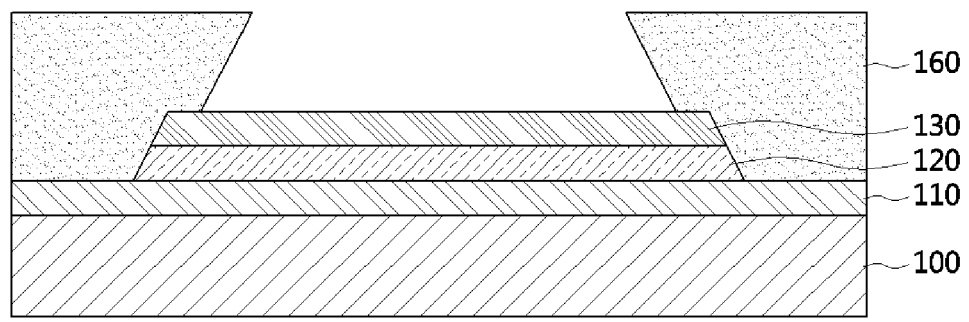

Referring to FIG. 20, a photoresist pattern 160 is formed on or over the first semiconductor layer 110 exposed by forming a bottom surface of the mesa region 150. The photoresist pattern 160 may have a vertical profile with respect to the surface of the first semiconductor layer 110. In some embodiments, the photoresist pattern 160 may be formed to have an overhang structure having a bottom surface, with a smaller width than a top surface thereof. The photoresist pattern 160 is preferably a negative type. Accordingly, exposed portions are cross-linked. To form the overhang structure, the photoresist pattern 160 is preferably exposed at a predetermined angle. In the case of the overhang structure, a distance between bottom surfaces of the photoresist patterns 160 is preferably set to be at least about 1 μm greater than a distance between top surfaces thereof.

Furthermore, the photoresist pattern 160 is preferably provided to cover a portion of the surface of the second semiconductor layer 130. Accordingly, the portion of the top surface of the second semiconductor layer 130 may remain shielded by the photoresist pattern 160.

Figure 21:
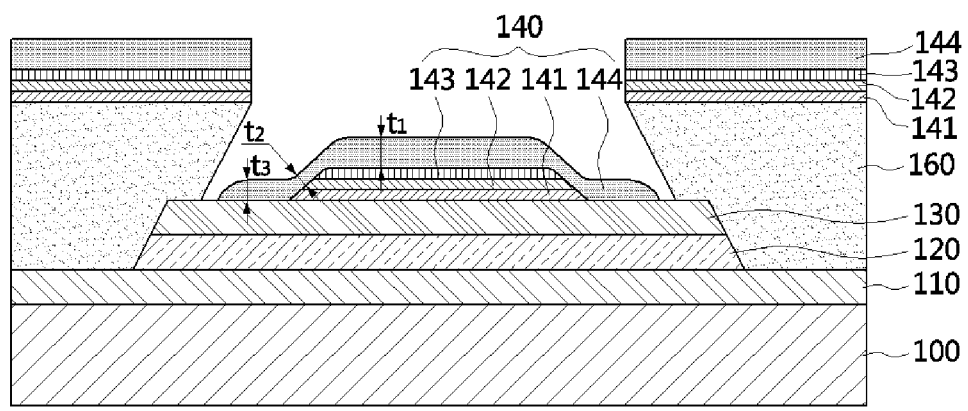

Referring to FIG. 21, a reflective metal layer 142 and a conductive barrier layer 144 are sequentially stacked on or over the second semiconductor layer 130 to form a reflection pattern 140. Also, in some embodiments, an ohmic contact layer 141 may be formed under the reflective metal layer 142, and a stress relaxation layer 143 may be additionally formed between the reflective metal layer 142 and the conductive barrier layer 144.

The reflective metal layer 142 includes Ai, an Al alloy, Ag, or an Ag alloy. The reflective metal layer 142 may be formed using an ordinary metal deposition process. However, the reflective metal layer 142 is preferably formed using an electronic beam (e-beam) evaporation process capable of moving most metal atoms or ions onto the surface of the second semiconductor layer 130 in a vertical direction. Thus, the metal atoms or ions may have anisotropic etching characteristics and enter a space between the photoresist patterns 160 to form the reflective metal layer 142.

The reflective metal layer 142 preferably has a thickness of about 100 nm to about 1 μm. When the reflective metal layer 142 has a thickness of less than about 100 nm, light generated by the active layer 120 is not smoothly reflected. Also, when the reflective metal layer 142 has a thickness of more than about 1 μm, process loss may occur due to an excessive process time.

The ohmic contact layer 141 may be formed before forming the reflective metal layer 142, as needed. The ohmic contact layer 141 may include Ni, Pt, ITO, or ZnO. Also, the ohmic contact layer 141 is preferably formed to a thickness of about 0.1 nm to about 20 nm. When the ohmic contact layer 141 has a thickness of less than about 0.1 nm, sufficient ohmic characteristics cannot be ensured due to a very small layer thickness. Also, when the ohmic contact layer 141 has a thickness of more than about 20 nm, the transmitted amount of light is reduced to reduce the quantity of light reflected by the reflective metal layer 142 disposed on the ohmic contact layer 141.

The stress relaxation layer 143 is formed on the reflective metal layer 142.

The stress relaxation layer 143 may be formed using an ordinary metal deposition process, but is preferably formed using an e-beam evaporation method having a high directionality during a deposition process. That is, metal atoms or ions evaporated due to e-beams may have directionality and have anisotropy in a space between the photoresist patterns 160, and the stress relaxation layer 143 may be formed of a metal layer. Also, the stress relaxation layer 143 may have a lower coefficient of thermal expansion than the reflective metal layer 142 and a higher coefficient of thermal expansion than the conductive barrier layer 144 of FIG. 3. Accordingly, a material forming the stress relaxation layer 143 may be differently selected according to selected materials forming the reflective metal layer 142 and the conductive barrier layer 144.

When the reflective metal layer 142 and the stress relaxation layer 143 are formed using an e-beam evaporation method, a side surface of the reflective metal layer 142 and a side surface of the stress relaxation layer 143 are exposed. Also, the reflective metal layer 142 and the stress relaxation layer 143 corresponding to an open upper region of the photoresist pattern 160 are formed using an anisotropic deposition process.

Also, in an e-beam evaporation process, upper layers are formed along a profile of a side surface of the stress relaxation layer 143, but the upper layers are provided to cover or shield lower layers. A side surface of a structure including the stress relaxation layer 143 or the reflective metal layer 142 formed using the e-beam evaporation process is preferably inclined at an angle a of about 5° to about 45°. To embody the above-described angle a of the side surface, the substrate 100 may be in an inclined direction with respect to an e-beam source during a deposition process using the e-beam evaporation process. During the deposition process, the substrate 100 may rotate (i.e., revolve) around the e-beam source and also rotate on its own axis.

Subsequently, a conductive barrier layer 144 is formed through the opened region of the photoresist pattern 160.

The conductive barrier layer 144 includes W, TiW, Mo, Cr, Ni, Pt, Rh, Pd, or Ti. In particular, a material forming the conductive barrier layer 144 may vary according to selected materials forming the reflective metal layer 142 and the stress relaxation layer 143.

The conductive barrier layer 144 is formed on or over the stress relaxation layer 143 and shields side surfaces of the reflective metal layer 142 or the stress relaxation layer 143. Accordingly, a metal forming the reflective metal layer 142 is prevented from diffusing into the second semiconductor layer 130 due to lateral diffusion. The formation of the conductive barrier layer 144 is performed using an ordinary metal de-position process. However, the conductive barrier layer 144 is preferably formed using an isotropic etching process. This is at least because the conductive barrier layer 144 is configured to surround at least the side surfaces of the stress relaxation layer 143 and the reflective metal layer 142. For example, the conductive barrier layer 144 may be formed using a sputtering process.

In addition, the conductive barrier layer 144 may be a single layer formed to a thickness of about 100 nm or more by selecting a specific metal. Also, the conductive barrier layer 144 may be formed by alternately selecting at least two metal materials, and each of layers forming the conductive barrier layer 144 may be formed to a thickness of about 20 nm or more. For example, the conductive barrier layer 144 may be formed by alternately depositing a TiW layer having a thickness of about 50 nm and a Ni layer or Ti layer having a thickness of about 50 nm.

In particular, the conductive barrier layer 144 has a different thickness according to a state or gradient of an underlying layer, and is formed to extend to an upper portion of the second semiconductor layer 130. Since a gradient of a side surface of the underlying layer has an angle of about 45° or less, occurrence of cracks in the conductive barrier layer 144 due to sharp gradient is prevented.

Furthermore, a Ni/Au/Ti layer may be additionally formed on the conductive barrier layer 144 to enable a stable contact of the conductive barrier layer 144 with a subsequent material.

As described above, a material forming the stress relaxation layer 143 may be selected according to materials forming the reflective metal layer 142 and the conductive barrier layer 144. This is at least because a coefficient of thermal expansion of the stress relaxation layer 143 is higher than that of the conductive barrier layer 144 and lower than that of the reflective metal layer 142. Accordingly, when the reflective metal layer 142 includes Al or an Al alloy, and the conductive barrier layer 144 includes W, TiW, or Mo, the stress relaxation layer 143 may be a single layer formed of Ag, Cu, Ni, Pt, Ti, Rh, Pd, or Cr, or a combination formed of Cu, Ni, Pt, Ti, Rh, Pd or Au. Also, when the reflective metal layer 142 includes Al or an Al alloy, and the conductive barrier layer 144 includes Ti, Cr, Pt, Rh, Pd, or Ni, the stress relaxation layer 143 may be a single layer formed of Ag or Cu, or a combination formed of Ni, Au, Cu, or Ag. Furthermore, when the reflective metal layer 142 includes Ag or an Ag alloy, and the conductive barrier layer 144 includes W, TiW, or Mo, the stress relaxation layer 143 may be a single layer formed of Cu, Ni, Pt, Ti, Rh, Pd, or Cr, or a combination formed of Cu, Ni, Pt, Ti, Rh, Pd, Cr, or An. Also, when the reflective metal layer 142 includes Ag or an Ag alloy, and the conductive barrier layer 144 includes Pt or Ni, the stress relaxation layer 143 may be a single layer formed of Cu, Cr, Rh, Pd, TiW, or Ti, or a combination formed of Ni, Au, or Cu.

The ohmic contact layer 141, the reflective metal layer 142, the stress relaxation layer 143, and the conductive barrier layer 144 may be formed also on or over the photoresist pattern 160.

Figure 22:
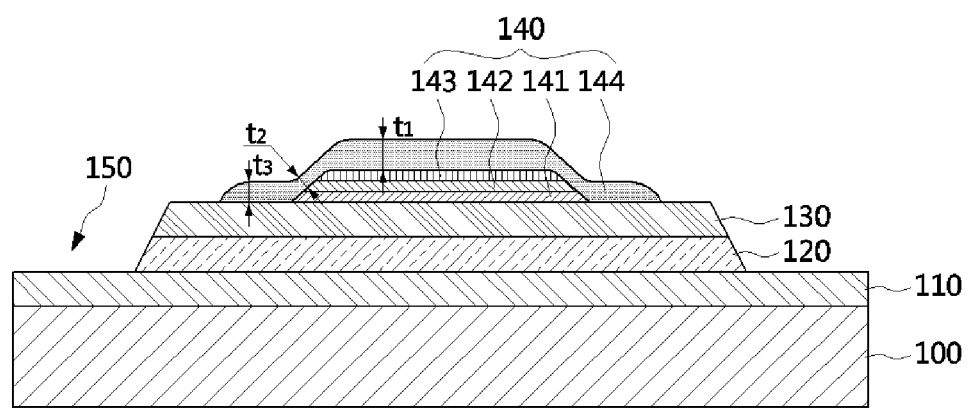

Referring to FIG. 22, the photoresist pattern 160 and the layers thereon are removed. Accordingly, the underlying second semiconductor layer 130 and the reflection pattern 140 disposed thereon are exposed. Also, the mesa region 150 is exposed by removing the photoresist pattern 160. This is substantially the same as described with reference to FIG. 17.

Due to the above-described processes, the reflection pattern 140 is formed on or over the second semiconductor layer 130. The reflection pattern 140 includes a reflective metal layer 142, a stress relaxation layer 143, and a conductive barrier layer 144. The stress relaxation layer 143 has a lower coefficient of thermal expansion than the reflective metal layer 142 and a higher coefficient of thermal expansion than the conductive barrier layer 144. Accordingly, stress caused due to a difference in coefficient of thermal expansion between the reflective metal layer 142 and the conductive barrier layer 144 is absorbed in the stress relaxation layer 143.

In addition, the conductive barrier layer 144 formed on the reflective metal layer 142 or the stress relaxation layer 143 has a different thickness according to the shape and kind of an underlying layer. For example, a thickness t1 of the conductive barrier layer 144 formed on or over the surface of the reflective metal layer 142 or the stress relaxation layer 143 is greater than a thickness t3 of the conductive barrier layer 144 formed on the surface of the second semiconductor layer 130. Also, the thickness t3 is greater than a thickness t2 of the conductive barrier layer 144 formed on or over side surfaces of the reflective metal layer 142 or the stress relaxation layer 143.

The difference in thickness is a result obtained by performing an isotropic deposition process after a photoresist pattern having an overhang structure is formed. That is, de-position is performed to the highest extent on a top surface of the reflective metal layer 142 or stress relaxation layer 143, which is opened by the photoresist pattern, and deposition may be performed to a relatively high extent on a surface of the second semiconductor layer 130 because the second semiconductor layer 130 has a planar structure. In contrast, since a side surface of the reflective metal layer 142 or the stress relaxation layer 143 has a predetermined inclination and a deposited metal should be adhered to sidewalls of the reflective metal layer 142 or the stress relaxation layer 143, deposition is performed to a relatively low extent on the side surface of the reflective metal layer 142 or the stress relaxation layer 143.

Furthermore, the side surface of the reflective metal layer 142 or the stress relaxation layer 143 is formed at an inclination angle a of about 5° to about 45°. A required or desired inclined angle may be formed by controlling an angle of a substrate during an e-beam evaporation process. That is, by orienting the substrate at a predetermined angle with respect to an imaginary direction in which metal ions or particles are predicted to proceed, the inclination angle a of the side surface of the reflective metal layer 142 or the stress relaxation layer 143 may be controlled. By setting the inclined angle a of the side surface, occurrence of cracks in a conductive barrier layer 144 that will be formed subsequently is prevented.

Embodiment 4

FIGS. 23 through 27 are plan views and cross-sectional views of LED modules to which the structure of FIG. 3 or FIG. 10 is applied, according to a fourth exemplary embodiment of the disclosed technology.

Figure 23:
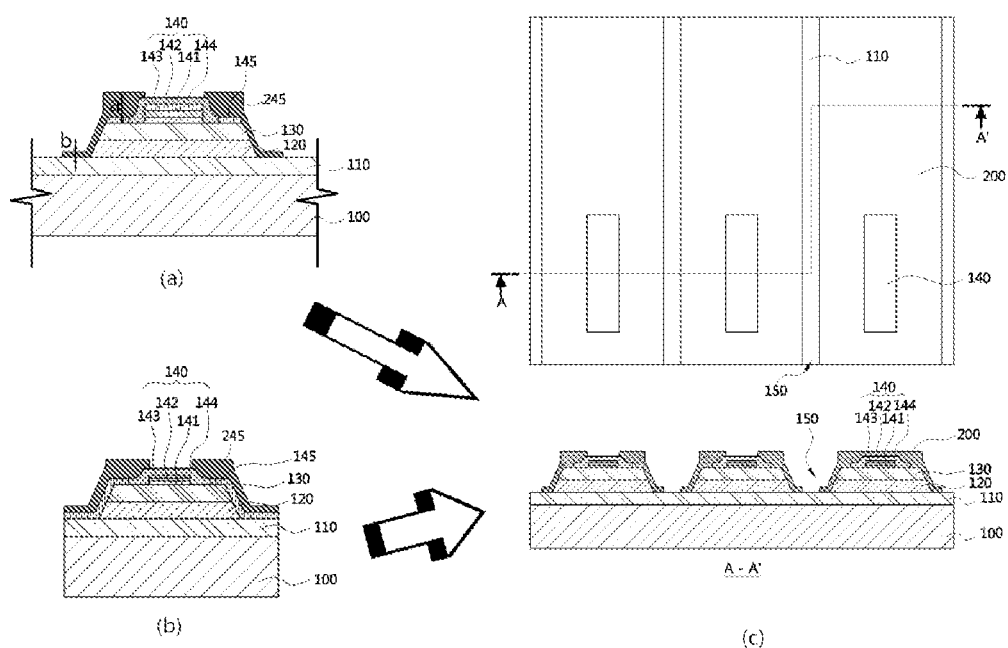
FIGS. 23 through 27 illustrate plan views and cross-sectional views of LED modules to which the structure of FIG. 3

Referring to FIG. 23, it is assumed that the mesa region(s) 150 of FIG. 3 or FIG. 10 is a region etched in a stripe shape. Subsequently, a first insulating layer 200 is formed on or over the entire surface of the structure of FIG. 3 or FIG. 10. The first insulating layer 200 exposes a portion of a top surface of the reflection pattern 140 and exposes a surface of the first semiconductor layer 110. Accordingly, a surface of a conductive barrier layer 144 is exposed.

Also, the first insulating layer 200 is formed by coating an insulating material on the entire surface of the structure of FIG. 3 or FIG. 10. However, as seen in FIGS. 23 (a) and (b), the coated insulating material 245 and the protective insulating layer 145 of FIG. 3 or FIG. 10 can be referred to as a combined first insulating layer 200. This is at least because the insulating material 245 and the protective insulating layer 145 have the same or similar electrical properties. For example, the insulating material 245 and the protective insulating layer 145 have the same insulating characteristics. Accordingly, the insulating material 245 and the protective insulating layer 145 can be referred to as a combined first insulating layer 200. Accordingly, by etching the first insulating layer 200, the surface of the first semiconductor layer 110 is exposed, and a reflection pattern 140 disposed on the surface of the first semiconductor layer 110 is exposed. When the combined first insulating layer 200 is formed by coating an insulating material on the entire surface of the structure of FIG. 3, the first insulating layer 200 disposed over the first semiconductor layer 110 is made up of insulating material 245 only while the first insulating layer 200 disposed over the second semiconductor layer 130 is made up of the protective insulating layer 145 and added insulating material 245. Therefore, the thickness "a" is greater than the thickness "b" in FIG. 23(a).

To form the first insulating layer 200, an oxide layer (e.g., a $SiO_2$ layer), a nitride layer (e.g., a SiN layer), an insulating layer (e.g., a $MgF_2$ layer), or a debragg reflector (DBR) layer (e.g., a $SiO_2/TiO_2$ layer) is formed on or over the resultant structure of FIGS. 23(a), (b) and (c). Thereafter, a portion of the reflection pattern 140 and the surface of the first semiconductor layer 110 are exposed using an ordinary photolithography process.

A view disposed under the plan view of FIGS. 23 (a), (b) and (c) is a cross-sectional view obtained by cutting the plan view of FIG. 13 along direction A-A'. In the cross-sectional view, line A-A' is discontinuous, and a dotted line is not reflected in the cross-sectional view. However, it is assumed that the discontinuous line is continuous in the cross-sectional view. Hereinafter, this assumption will be applied likewise.

Also, although the present embodiment describes an example in which three reflection patterns 140 are exposed, the disclosed technology is not limited to the example, and the number of exposed reflection patterns 140 may be changed.

The reflection pattern 140 is exposed in a partial region, and the first semiconductor layer 110 is exposed in the mesa region 150. Also, the first insulating layer 200 completely shields the reflection pattern 140 in a region in which the reflection pattern 140 is not exposed.

Figure 24:
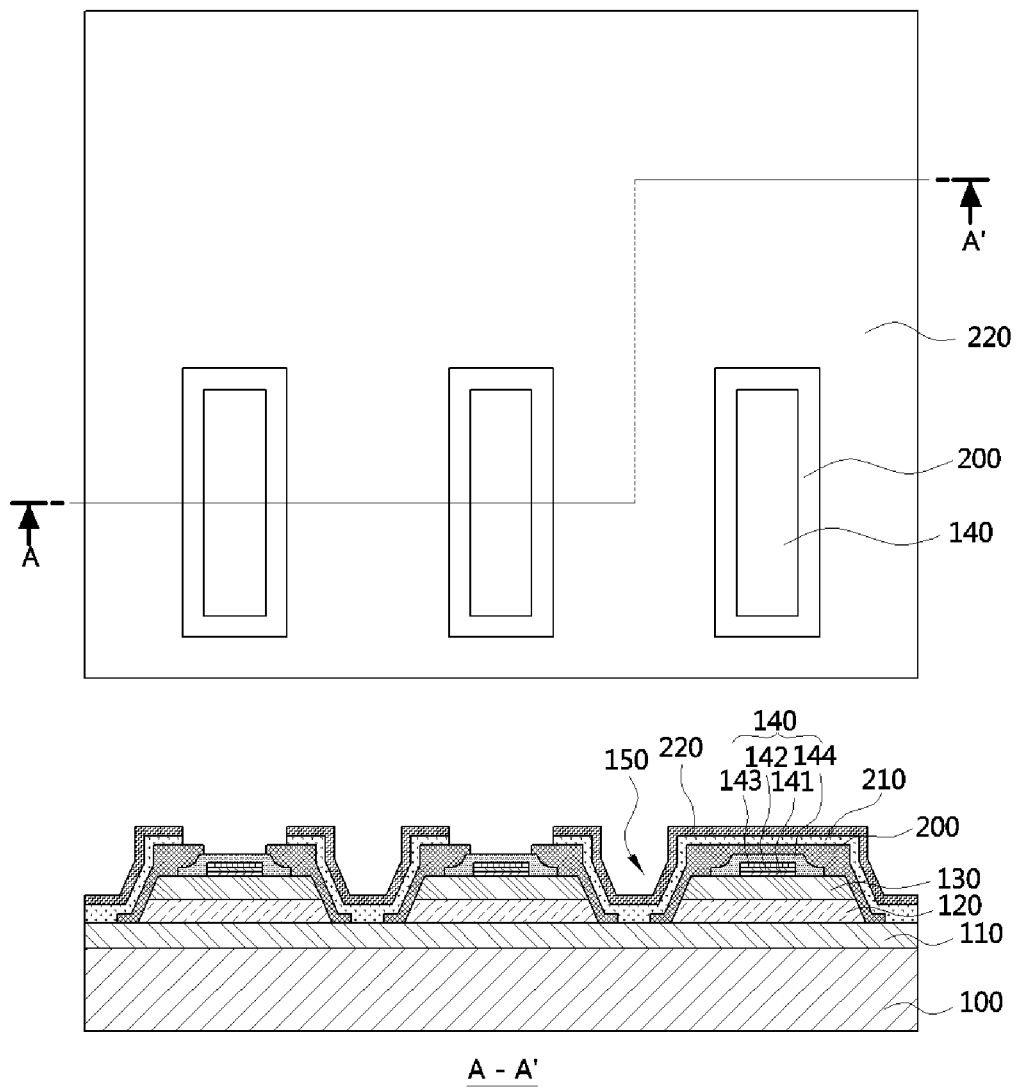

Referring to FIG. 24, a conductive reflection layer 210 and a reflective barrier layer 220 are formed on the first insulating layer 200.

The conductive reflection layer 210 is formed of a conductive material. Also, the conductive reflection layer 210 exposes a portion of the reflection pattern 140.

The conductive reflection layer 210 includes Al. Accordingly, the first semiconductor layer 110 and the conductive reflection layer 210 are electrically connected to each other, and the reflection pattern 140 is electrically insulated from the conductive reflection layer 210 by the first insulating layer 200.

In addition, a reflective barrier layer 220 is formed on or over the conductive reflection layer 210. The reflective barrier layer 220 prevents diffusion of a metal forming the conductive reflection layer 210. The reflective barrier layer 220 may be a single layer formed of Ni, Cr, or An, or a combination thereof. The reflective barrier layer 220 is preferably a combination formed of Ti/Al/Ti/Ni/An. Also, an adhesive layer (not shown) may be further provided under the conductive reflection layer 210. The adhesive layer may include Ti, Cr, or Ni.

The formation of the conductive reflection layer 210 and the reflective barrier layer 220 may be performed by sequentially stacking the conductive reflection layer 210 and the reflective barrier layer 220 and patterning the conductive reflection layer 210 and the reflective barrier layer 220 using an etching process. In addition, the conductive reflection layer 210 and the reflective barrier layer 220 may be formed using a lift-off process. That is, photoresist is coated on the reflection pattern 140, and the conductive reflection layer 210 and the reflective barrier layer 220 are formed using an ordinary deposition process. Subsequently, by removing the photoresist from the reflection pattern 140, the conductive reflection layer 210 and the reflective barrier layer 220 are formed to expose the reflection pattern 140.

The above descriptions will be understood with reference to a lower cross-sectional view of FIG. 24. That is, the reflection pattern 140 is exposed in a cross-section through two exposed reflection patterns 140 in line A-A', while the first insulating layer 200 is formed on or over the reflection pattern 140, and the conductive reflection layer 210 and the reflective barrier layer 220 are formed on the first insulating layer 200 in a cross-section through a region filled with only the conductive reflection layer 210 and the reflective barrier layer 220.

Since the conductive reflection layer 210 includes an Al material, the conductive reflection layer 210 may reflect light generated by an active layer 120. Accordingly, the conductive reflection layer 210 is in electrical contact with the first semiconductor layer 110 and serves as a reflection layer configured to reflect light. Also, the reflective barrier layer 220 formed on the conductive reflection layer 210 prevents diffusion of metal particles forming the conductive reflection layer 210.

In addition, by interposing a contact layer, an ohmic contact between the conductive reflection layer 210 and the first semiconductor layer 110 may be easily formed.

Figure 25:
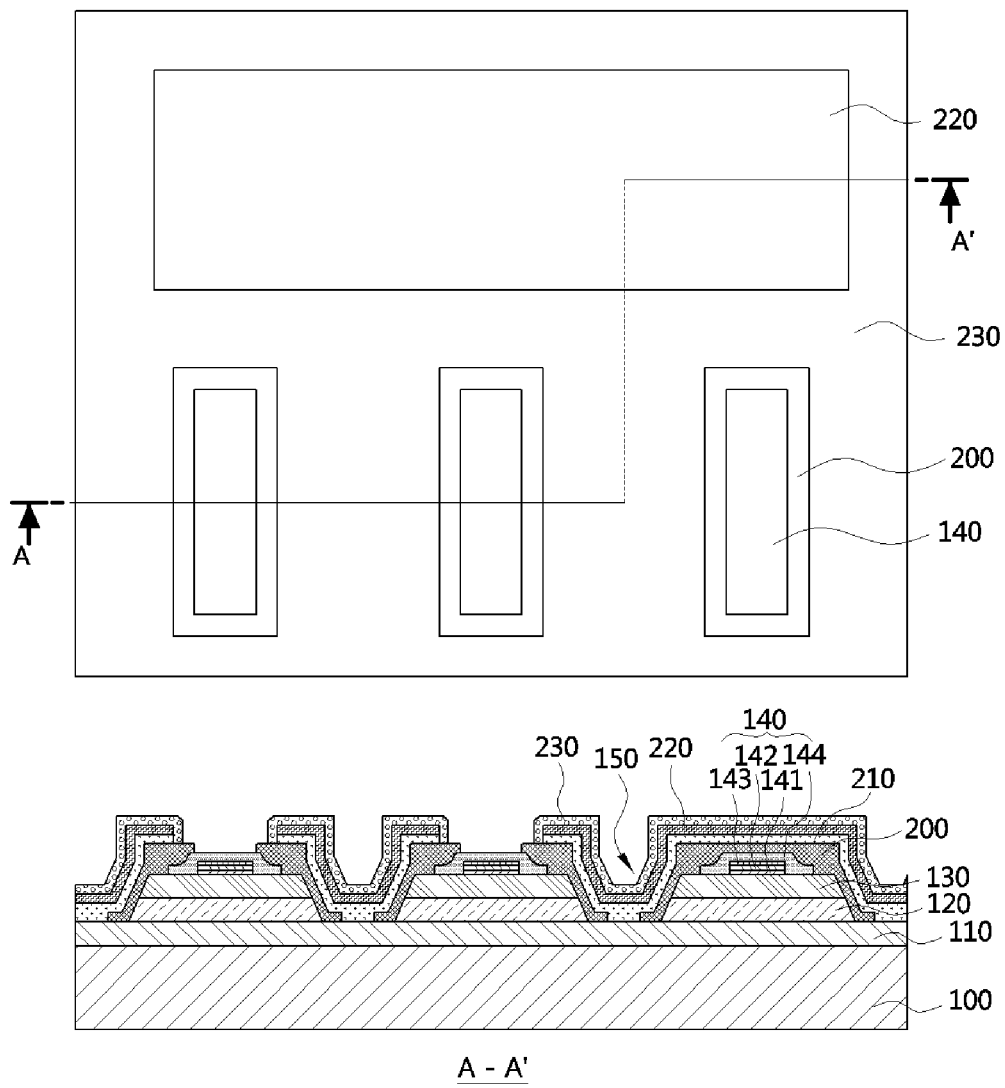

Referring to FIG. 25, a second insulating layer 230 is formed on the resultant structure of FIG. 24. A portion of the reflective barrier layer 220 is exposed through the second insulating layer 230, and a portion of the reflection pattern 140 is also exposed. The reflection pattern 140 remains electrically connected to the second semiconductor layer 130, and the reflective barrier layer 220 remains electrically connected to the first semiconductor layer 110 through the conductive reflection layer 210.

The second insulating layer 280 may be formed of any insulating material. Accordingly, an oxide-based insulating material, a nitride-based insulating material, a polymer (e.g., polyimide, Teflon, or parylene) may be used to form the second insulating layer 230.

Figure 26:
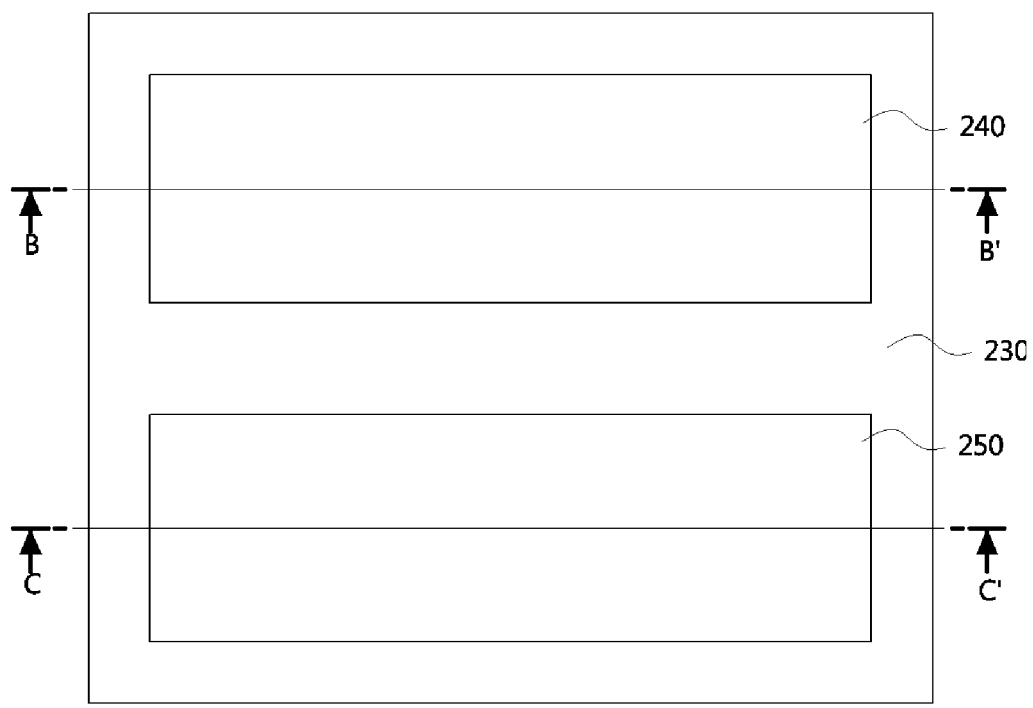

Referring to FIG. 26, a first pad 240 and a second pad 250 are formed on or over the resultant structure of FIG. 25. The first pad 240 is electrically connected to the conductive reflection layer 210 through the exposed reflective barrier layer 220 in FIG. 25. Accordingly, the first pad 240 and the first semiconductor layer 110 are electrically connected to each other. This indicates that the first semiconductor layer 110 is electrically connected to an external power source or power supply line through the first pad 240. Also, the second pad 250 is electrically connected to the exposed reflection pattern 140 in FIG. 25. Accordingly, the second pad 250 and the second semiconductor layer 130 are electrically connected. This indicates that the second semiconductor layer 130 is electrically connected to an external power source or power supply line through the second pad 250.

The first pad 240 and the second pad 250 may have a double structure including a layer including Ti, Cr, or Ni and a layer including Al, Cu, Ag, or Au. Also, the first pad 240 and the second pad 250 may be formed by patterning photoresist, depositing a metal material between patterned spaces, and removing the deposited metal material using a lift-off process. Also, a double or single metal layer is formed, and then a pattern is formed using an ordinary photolithography process, and the first and second pads 240 and 250 may be formed by means of a dry etching process or wet etching process using the pattern. Here, an etchant used during the dry or wet etching process may be differently determined according to characteristics of an etched metal material.

In addition, a pad barrier layer 260 or 270 formed of a conductive material may be formed on the first pad 240 or the second pad 250. The pad barrier layer 260 or 270 is provided to prevent diffusion of a metal during a process of bonding or soldering the pads 240 and 250. For example, during the bonding or soldering process, tin (Sn) atoms contained in a bonding metal or soldering material are prevented from diffusing into the pads 240 and 250 and increasing the resistivity of the pads 240 and 250. To this end, the pad barrier layer 260 or 270 may include Cr, Ni, Ti W, TiW, Mo, Pt, or a combination thereof.

Figure 27:
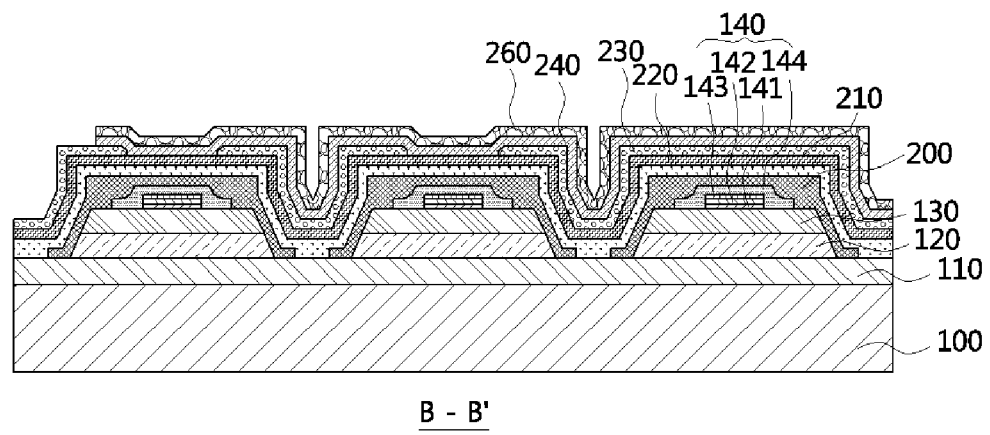
Figure 27:
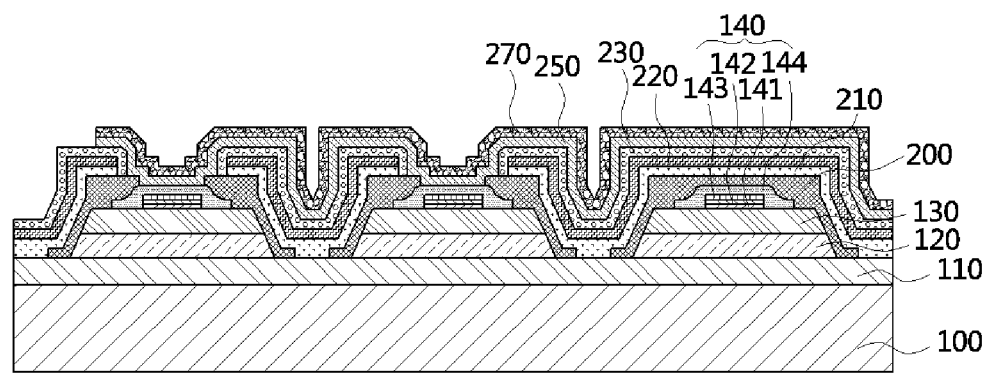

FIG. 27 illustrates cross-sectional views taken along lines B-B' and C-C' of FIG. 26.

To begin with, line B-B' cuts through a region in which the first pad 240 is formed. The first pad 240 is electrically connected to the exposed reflective barrier layer 220. Also, a first pad barrier layer 260 is formed on or over the first pad 240.

In addition, line C-C' cuts through a region in which the second pad 250 is formed. The second pad 250 is electrically connected to the exposed reflection pattern 140. Also, a second pad barrier layer 270 is formed on or over the second pad 250.

The first pad barrier layer 260 and the second pad barrier layer 270 are electrically isolated from each other.

As a result, it can be seen that the first pad 240 is electrically connected to the first semiconductor layer 110, and the second pad 250 is electrically connected to the second semiconductor layer 130.

Due to the above-described process, the conductive barrier layer 144 of the reflection pattern 140 is defined by the protective insulating layer 145. Accordingly, the conductive barrier layer 144 is coated on a space between protective insulating layers 145 and formed to surround top and side surfaces of the reflective metal layer 142 or the stress relaxation layer 143. Accordingly, a phenomenon where the conductive barrier layer 144 is formed on sidewalls of a photoresist pattern using a sputtering process to form points is prevented. Also, in an LED module using the above-described advantage, the first semiconductor layer 110 is exposed as a stripe type and in electrical contact with the first pad 240 through the conductive reflection layer 210 and the reflective barrier layer 220. Diffusion of a metal is prevented by the reflective barrier layer 220 provided between the conductive reflection layer 210 and the first pad 240. For instance, a metal forming the conductive reflection layer 210 is prevented from moving to the first pad 240 and increasing the resistivity of the first pad 240. Also, the second semiconductor layer 130 is electrically connected to the second pad 250. A pad barrier layer 260 or 270 is formed on each of the pads. The pad barrier layer 260 or 270 prevents diffusion of a generated metal during a bonding or soldering process so that the first pad 240 or the second pad 250 can have a high conductivity and be in electrical contact with the outside.

Embodiment 5

Figure 28:
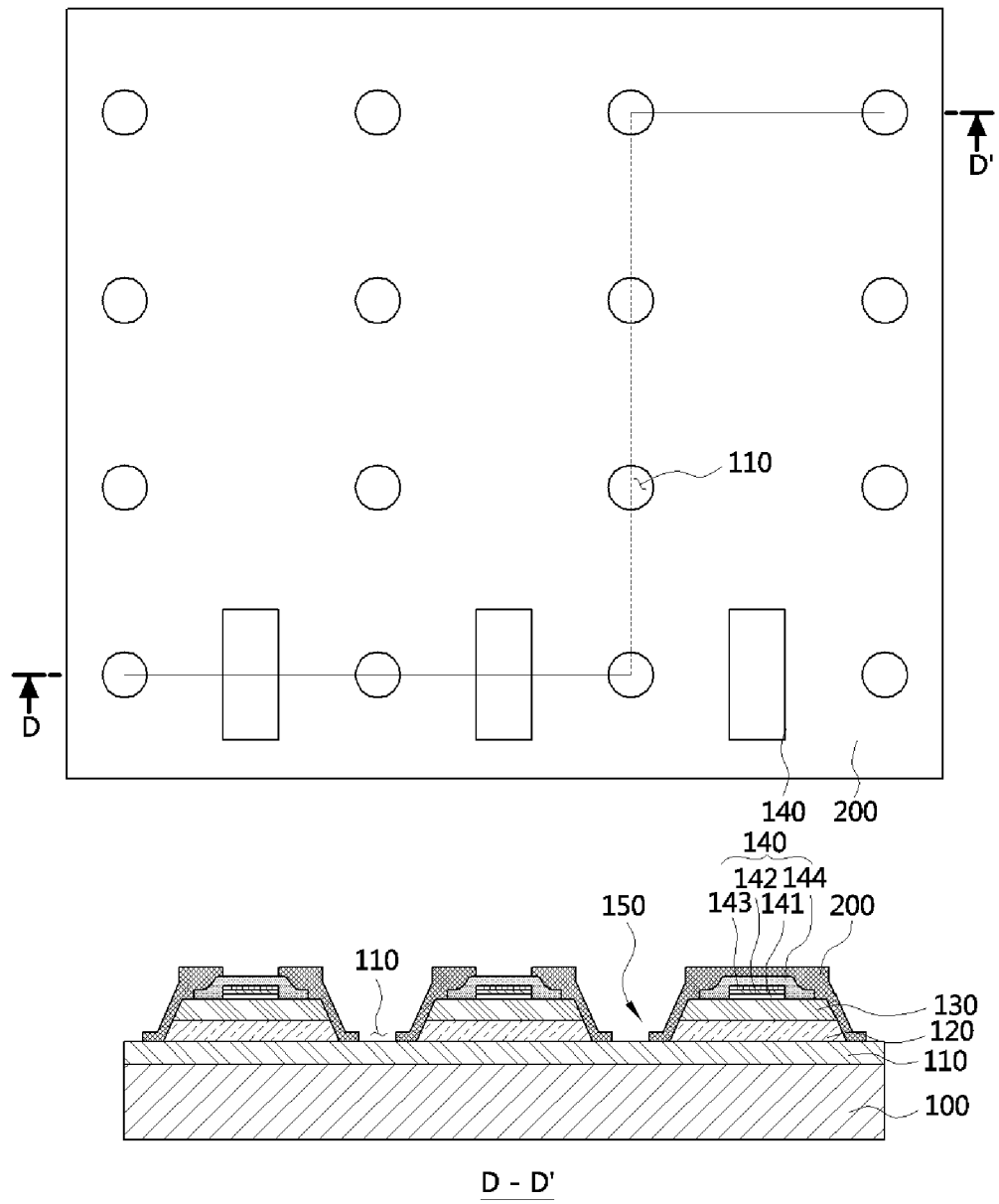
FIGS. 28 through 30 illustrate plan views and cross-sectional views of LED modules to which the structure of FIG. 3
Figure 29:
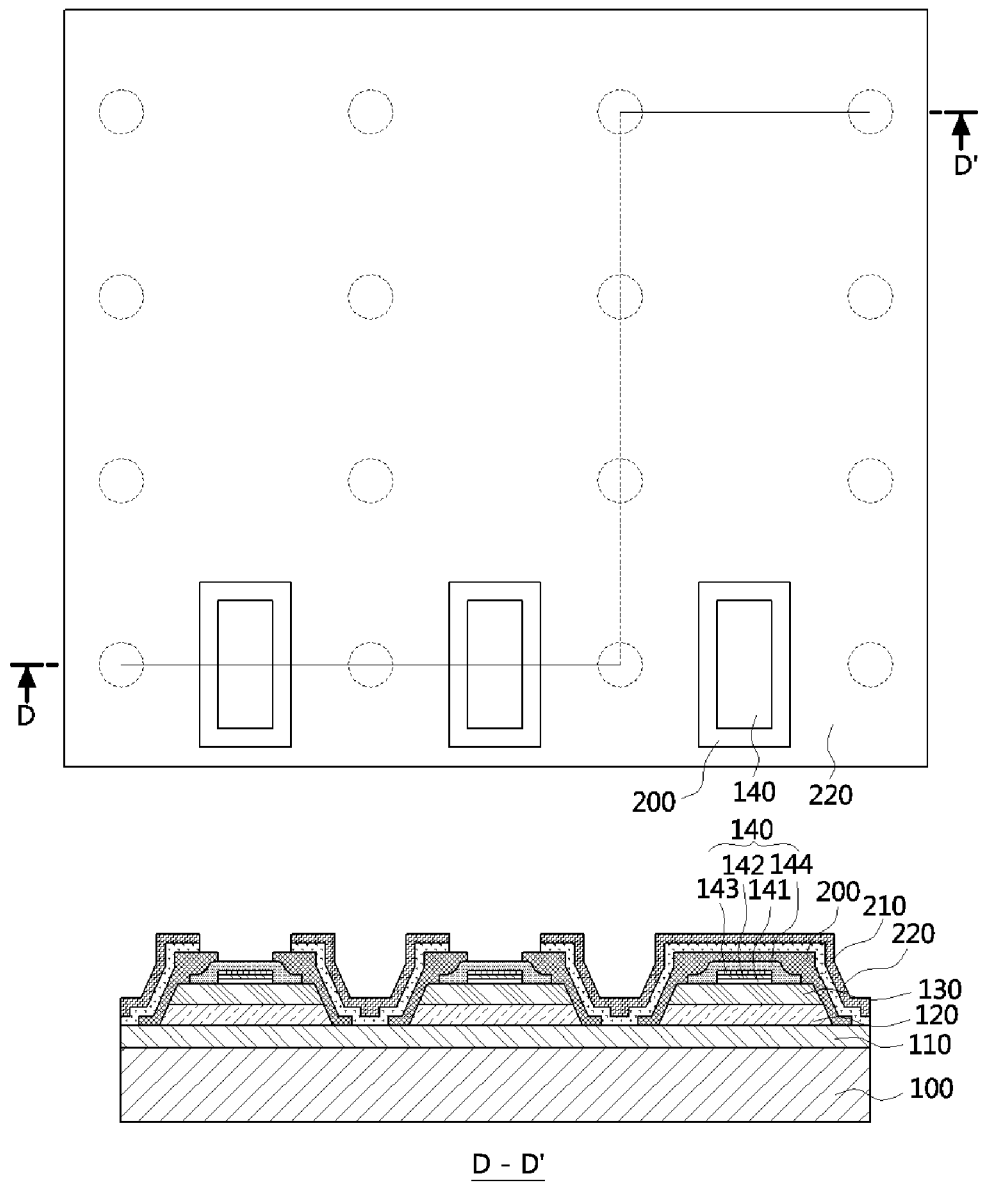
Figure 30:
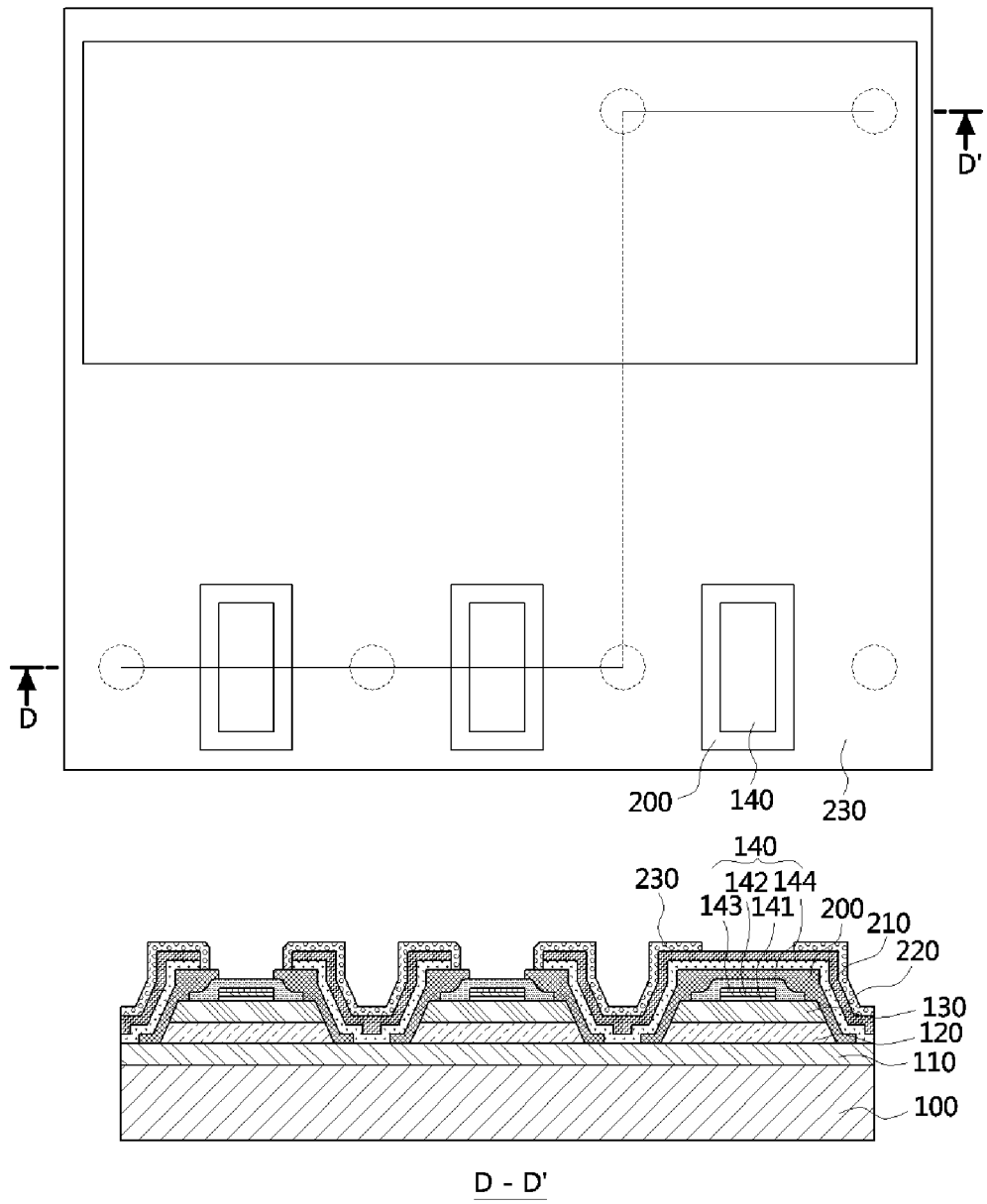

FIGS. 28 through 30 illustrate plan views and cross-sectional views of LED modules to which the structure of FIG. 3 of FIG. 10 is applied, according to a fifth exemplary embodiment of the disclosed technology.

Referring to FIG. 28, a mesa region 150 is formed as a hole type shown in FIGS. 3 and 10. Accordingly, a first semiconductor layer 110 is exposed in a roughly circular shape.

Subsequently, a first insulating layer 200 is formed on the entire surface of the structure of FIG. 28. The first insulating layer 200 exposes a portion of a top surface of the reflection pattern 140 and exposes the surface of the first semiconductor layer 110. The formation of the first insulating layer 200 is the same as described in Embodiment 4 with reference to FIG. 23, and thus a description thereof is omitted.

A view disposed under the plan view of FIG. 28 is a cross-sectional view obtained by cutting the plan view of FIG. 28 along direction D-D'. In the cross-sectional view, line D-D' is discontinuous on a dotted line and formed by connecting solid lines to the dotted line. Accordingly, only the solid lines, and not the dotted line, are reflected in the cross-sectional view.

The reflection pattern 140 is exposed in a partial region, and the first semiconductor layer 110 is exposed in the mesa region 150. Also, the first insulating layer 200 completely shields the reflection pattern 140 in a region in which the reflection pattern 140 is not exposed.

Furthermore, the hole-type mesa region 150 is exaggerated for clarity in FIG. 28. Accordingly, the number and shape of hole-type mesa regions 150 may be sufficiently changed in some embodiments.

Referring to FIG. 29, a conductive reflection layer 210 and a reflective barrier layer 220 are formed on or over the first insulating layer 200. Materials and forming processes of the conductive reflection layer 210 and the reflective barrier layer 220 are the same as described with reference to FIG. 24. Also, the conductive reflection layer 210 and the reflective barrier layer 220 expose a portion of the reflection pattern 140.

Accordingly, the first semiconductor layer 110 and the reflective barrier layer 220 are electrically connected through the conductive reflection layer 210, and the reflection pattern 140 is electrically insulated from the conductive reflection layer 210 by the first insulating layer 200.

The above descriptions will be understood with reference to a lower cross-sectional view of FIG. 29. That, is, the reflection pattern 140 is exposed in a cross-section through two exposed reflection patterns 140 in line D-D' while the first insulating layer 200 is formed on or over the reflection pattern 140, and the conductive reflection layer 210 and the reflective barrier layer 220 are formed on or over the first insulating layer 200 in a cross-section through a region filled with only the conductive reflection layer 210 and the reflective barrier layer 220. Also, the conductive reflection layer 210 and the reflective barrier layer 220 are formed on or over a surface of the first semiconductor layer 110 exposed as a hole type in FIG. 29.

Since the conductive reflection layer 210 includes an Al material, the conductive reflection layer 210 may reflect light generated by the active layer 120. Accordingly, the conductive reflection layer 210 is in electrical contact with the first semiconductor layer 110 and serves as a reflection layer configured to reflect light.

Before forming the conductive reflection layer 210, a contact layer having the shame shape as the conductive reflection layer 210 may be additionally formed. The contact layer includes Ti, Cr, or Ni. By interposing the contact layer, an ohmic contact may be easily formed between the conductive reflection layer 210 and the first semiconductor layer 110.

Furthermore, the reflective barrier layer 220 formed on or over the conductive reflection layer 210 may be a single layer formed of Ni, Cr, or Au, or a combination thereof. The reflective barrier layer 220 is preferably a combination formed of Ti/Al/Ti/Ni/Au.

Referring to FIG. 30, a second insulating layer 230 is formed. A portion of the reflective barrier layer 220 is exposed through the second insulating layer 230, and a portion of the reflection pattern 140 is exposed. The reflection pattern 140 remains electrically connected to the second semiconductor layer 130, and the conductive reflection layer 210 remains electrically connected to the first semiconductor layer 110. Accordingly, an electrical path between the first semiconductor layer 110 and the second semiconductor layer 130 is opened by the second insulating layer 230.

A material and formation of the second insulating layer 230 are the same as described with reference to FIG. 25, and thus a description thereof is omitted.

Subsequently, a first pad (not shown) and a second pad (not shown) are formed as described with reference to FIG. 26. The first pad is electrically connected to the exposed conductive reflection layer 210 in FIG. 30, Accordingly, the first pad and the first semiconductor layer 110 are electrically connected to each other. This indicates that the first semiconductor layer 110 is electrically connected to an external power source or power supply line through the first pad. Also, the second pad is electrically connected to the exposed reflection pattern 140 in FIG. 30. Accordingly, the second pad and the second semiconductor layer 130 are electrically connected. This indicates that the second semiconductor layer 130 is electrically connected to an external power source or power supply line through the second pad.

In addition, a pad barrier layer formed of a conductive material may be formed on or over the first pad or the second pad. The pad barrier layer is provided to prevent diffusion of a metal during a process of bonding or soldering the pads.

For example, during the bonding or soldering process, tin (Sn) atoms contained in a bonding metal or soldering material are prevented from diffusing into the pads and increasing the resistivity of the pads. To this end, the pad barrier layer may include Cr, Ni, Ti W, TiW, Mo, Pt, or a combination thereof.

Due to the above-described process, the conductive barrier layer 144 of the reflection pattern 140 is defined by the protective insulating layer 145. Accordingly, the conductive barrier layer 144 is coated on a space between protective insulating layers 145 and formed to surround top and side surfaces of the reflective metal layer 142 or the stress relaxation layer 143. Accordingly, a phenomenon where the conductive barrier layer 144 is formed on sidewalls of a photoresist pattern using a sputtering process to form points is prevented. Also, in an LED module using the above-described advantage, the first semiconductor layer 110 is exposed as a stripe type and in electrical contact with the first pad through the conductive reflection layer 210 and the reflective barrier layer 220. Diffusion of a metal is prevented by the reflective barrier layer 220 provided between the conductive reflection layer 210 and the first pad 240. For instance, a metal forming the conductive reflection layer 210 is prevented from moving to the first pad and increasing the resistivity of the first pad. Also, the second semiconductor layer 130 is electrically connected to the second pad. A pad barrier layer is formed on each of the pads. The pad barrier layer prevents diffusion of a generated metal during a bonding or soldering process so that the first pad or the second pad can have a high conductivity and be in electrical contact with the outside.

While the invention has been shown and described with reference to m certain exemplary embodiments thereof, it will be understood by those skilled in the art that various changes in form and details may be made therein without departing from the spirit and scope of the invention as defined by the appended claims.

DESCRIPTION OF MAJOR SYMBOLS IN THE ABOVE FIGURES

100: Substrate 110: First semiconductor layer
120: Active layer 130: Second semiconductor layer
140: Reflection pattern 141: Ohmic contact layer
142: Reflective metal layer 143: Stress relaxation layer
144: Conductive barrier layer 145: Protective insulating layer
150: Mesa region 200: First insulating layer
210; Conductive reflection layer 220: Reflective barrier layer
230: Second insulating layer 240: First pad
250: Second pad 260: First pad barrier layer
270: Second pad barrier layer

What is claimed is:

1. A light emitting diode (LED), comprising:
a substrate;
a first semiconductor layer disposed on the substrate;
an active layer disposed on a portion of the first semiconductor layer;
a second semiconductor layer disposed on the active layer;
a reflection pattern disposed on a portion of the second semiconductor layer; and
a first insulating layer comprising a first portion having a first thickness and a second portion having a second thickness different from the first thickness,
wherein:
the first portion is disposed on the reflection pattern; and
the second portion is disposed on the second semiconductor layer.

2. The LED of claim 1, wherein the second thickness is greater than the first thickness.

3. The LED of claim 1, wherein the first insulating layer has a first opening exposing the reflection pattern.

4. The LED of claim 1, wherein:
the first semiconductor layer supports a number of upper layers; and
a trench or a hole is formed in the upper layers and extends to the first semiconductor layer.

5. The LED of claim 1, further comprising:
a second insulating layer disposed over the first insulating layer; and
a conductive metal layer disposed between the first insulating layer and the second insulating layer,
wherein the conductive metal layer is electrically connected to the first semiconductor layer, and has an opening exposing a portion of the reflection pattern through an opening of the first insulating layer.

6. The LED of claim 2, wherein the reflection pattern further comprises:
a reflective metal layer;
a conductive barrier layer disposed on the reflective metal layer;
an ohmic contact layer disposed between the second semiconductor layer and the reflective metal layer; and
a stress relaxation layer disposed between the reflective metal layer and the conductive barrier layer.

7. The LED of claim 2, wherein:
the first insulating layer further comprises a third portion having a third thickness disposed on the first semiconductor layer; and
the third thickness is substantially the same as the first thickness of the first portion.

8. The LED of claim 7, wherein:
the second portion of the first semiconductor layer does not overlap the reflection pattern; and
the third portion of the first semiconductor layer does not overlap the second semiconductor layer.

9. The LED of claim 3, wherein the first insulating layer further has a second opening exposing the first semiconductor layer.

10. The LED of claim 8, further comprising:
a first pad and a second pad spaced apart from each other,
wherein the first and second pads are electrically connected to the conductive metal layer and the reflection pattern, respectively.

11. A light emitting diode (LED), comprising:
a substrate;
a first semiconductor layer disposed on the substrate;
an active layer disposed on a portion of the first semiconductor layer;
a second semiconductor layer disposed on the active layer;
a reflection pattern disposed on a portion of the second semiconductor layer; and
a first insulating layer comprising a first portion having a first thickness and a second portion having a second thickness different from the first thickness,
wherein:
the first portion is disposed on the second semiconductor layer; and
the second portion is disposed on the first semiconductor layer.

12. The LED of claim 11, wherein the first thickness is greater than the second thickness.

13. The LED of claim 11, wherein the reflection pattern comprises:
- a reflective metal layer; and
- a conductive barrier layer disposed on the reflective metal layer.

14. The LED of claim 11, wherein:
- the second portion of the first insulating layer has an opening exposing the first semiconductor layer; and
- the first insulating layer has an opening exposing the reflection pattern.

15. The LED of claim 11, wherein:
- the first semiconductor layer supports a number of upper layers; and
- a trench or a hole is formed in the upper layers and extends to the first semiconductor layer.

16. The LED of claim 11, further comprising:
- a second insulating layer disposed over the first insulating layer;
- a conductive metal layer disposed between the first insulating layer and the second insulating layer;
- a first pad electrically connected to the conductive metal layer; and
- a second pad spaced apart from the first pad and electrically connected to the reflection pattern,
- wherein the conductive metal layer is electrically connected to the first semiconductor layer, and has an opening exposing a portion of the reflection pattern through an opening of the first insulating layer.

17. The LED of claim 12, wherein:
- the first insulating layer further comprises a third portion having a third thickness disposed on the reflection pattern; and
- the first thickness is greater than the third thickness.

18. The LED of claim 12, wherein:
- the first portion of the first insulating layer does not overlap the reflection pattern; and
- the second portion of the first insulating layer does not overlap the second semiconductor layer.

19. The LED of claim 17, where the second thickness is substantially the same as the first thickness.

20. The LED of claim 13, wherein the reflection pattern further comprises:
- an ohmic contact layer disposed between the second semiconductor layer and the reflective metal layer; and
- a stress relaxation layer disposed between the reflective metal layer and the conductive barrier layer.

* * * * *